(12) United States Patent
Daughton et al.

(10) Patent No.: US 6,777,730 B2
(45) Date of Patent: Aug. 17, 2004

(54) ANTIPARALLEL MAGNETORESISTIVE MEMORY CELLS

(75) Inventors: James M. Daughton, Eden Prairie, MN (US); Arthur V. Pohm, Ames, IA (US); Dexin Wang, Eden Prairie, MN (US)

(73) Assignee: NVE Corporation, Eden Prairie, MN (US)

(*) Notice: Subject to any disclaimer, the term of this patent is extended or adjusted under 35 U.S.C. 154(b) by 0 days.

(21) Appl. No.: 10/230,474

(22) Filed: Aug. 29, 2002

(65) Prior Publication Data

US 2003/0048676 A1 Mar. 13, 2003

Related U.S. Application Data

(60) Provisional application No. 60/316,640, filed on Aug. 31, 2001.

(51) Int. Cl.[7] .................. H01L 31/119; H01L 21/00; G11C 11/00
(52) U.S. Cl. .................. 257/295; 257/311; 438/3; 438/257; 365/158; 365/145
(58) Field of Search .................. 257/295, 310, 257/311; 438/3, 257; 365/158, 145, 154, 157, 185.07

(56) References Cited

U.S. PATENT DOCUMENTS

| | | | |
|---|---|---|---|
| 4,945,397 A | * 7/1990 | Schuetz | 257/421 |
| 5,251,170 A | * 10/1993 | Daughton et al. | 365/158 |
| 5,343,422 A | 8/1994 | Kung et al. | 365/173 |
| 5,347,485 A | 9/1994 | Taguchi et al. | 365/171 |
| 5,477,482 A | 12/1995 | Prinz | 365/129 |
| 5,541,868 A | 7/1996 | Prinz | 365/98 |
| 5,640,343 A | 6/1997 | Gallagher et al. | 365/171 |
| 5,650,958 A | 7/1997 | Gallagher et al. | 365/173 |
| 5,734,605 A | 3/1998 | Zhu et al. | 365/173 |
| 5,936,293 A | * 8/1999 | Parkin | 257/422 |
| 5,949,707 A | 9/1999 | Pohm et al. | 365/158 |
| 5,966,012 A | 10/1999 | Parkin | |
| 5,966,322 A | * 10/1999 | Pohm et al. | 365/158 |

(List continued on next page.)

OTHER PUBLICATIONS

J.–E. Wegrowe, D. Kelly, X. Hoffer, Ph. Guittienne, J.–Ph. Ansermet. Tailoring AMR and GMR Hysteresis Loops with Spin–Polarized Current Injection. *Institut de Physique Expérimentale, Ecole Polytechnique Fédéale de Lausanne*, CH– 1015 Lausanne, Switzerland. Dec. 4, 2000.

(List continued on next page.)

*Primary Examiner*—David Nelms
*Assistant Examiner*—Long Tran
(74) *Attorney, Agent, or Firm*—Kinney & Lange, P.A.

(57) ABSTRACT

A ferromagnetic thin-film based digital memory having a plurality of bit structures electrically interconnected with information storage and retrieval circuitry that avoids information loss in one bit structure because of operating the others through this circuitry. Each of these bit structures formed of a relative orientation maintenance intermediate layer having two major surfaces on opposite sides thereof with a pair of memory films of an anisotropic ferromagnetic material each on a corresponding one of said relative orientation maintenance intermediate layer major surfaces. The relative orientation maintenance intermediate layer is of a material and a selected thickness so as to maintain magnetizations of said memory films oriented in substantially opposite directions. Interconnection electrodes pairs are each in electrically conductive contact with a corresponding one of the bit structures on substantially opposite sides thereof near or at substantially opposite edges of the relative orientation maintenance intermediate layer major surface. A magnetization reference direction layer able to maintain relatively well its magnetization orientation can be provided across a nonmagnetic layer from one of the pair of memory films with the nonmagnetic layer being either electrically conductive or insulative.

68 Claims, 16 Drawing Sheets

U.S. PATENT DOCUMENTS

| | | | |
|---|---|---|---|
| 5,978,257 A | | 11/1999 | Zhu et al. .................... 365/173 |
| 6,021,065 A | | 2/2000 | Daughton et al. ........... 365/158 |
| 6,048,739 A | * | 4/2000 | Hurst et al. ..................... 438/3 |
| 6,124,711 A | | 9/2000 | Tanaka et al. ............... 324/252 |
| 6,147,900 A | * | 11/2000 | Pohm .......................... 365/158 |
| 6,172,902 B1 | | 1/2001 | Wegrowe et al. ............ 365/158 |
| 6,275,411 B1 | * | 8/2001 | Daughton et al. ........... 365/158 |
| 6,349,053 B1 | * | 2/2002 | Daughton et al. ........... 365/145 |
| 6,385,082 B1 | | 5/2002 | Abraham et al. |
| 6,538,919 B1 | | 3/2003 | Abraham et al. |

OTHER PUBLICATIONS

J.–E. Wegrowe. Thermokinetic Approach of the Generalized Landau–Lifshitz–Gilbert Equation with Spin–Polarized Current. The American Physical Society, *Physical Review B*, vol. 62 No. 2, 1067–1074, Jul. 1, 2000–II.

A. Veloso and P.P. Freitas. Spin Valve Sensors with Synthetic Free and Pinned Layers. *Journal of Applied Physics*, vol. 87 No. 9, 5744–5746, May 1, 2000.

J.A. Katine, F.J. Albert, R.A. Buhrman, E.B. Myers and D.C. Ralph. Current–Driven Magnetization Reversal and Spin–Wave Excitations in Co/Cu/Co Pillars. The American Physical Society, *Physical Review Letters*, vol. 84 No. 14, 3149–3152, Apr. 3, 2000.

E.B. Myers, D.C. Ralph, J.A. Katine, R.N. Louie, and R.A. Buhrman. Current–Induced Switching of Domains in Magnetic Multilayer Devices. American Association for the Advancement of Science, *Science*, vol. 285, 867–870, Aug. 6, 1999.

J.–E. Wegrowe, D. Kelly, Y. Jaccard, Ph. Guittienne and J.–Ph. Ansermet. Current–Induced Magnetization Reversal in Magentic Nanowires. *Europhysics Letters*, 45 (5) pp. 626–632, Mar. 1, 1999.

A. Veloso, P.P. Freitas, and L.V. Melo. Spin Valves with Synthetic Ferrimagnet and Antiferromagnet Free and Pinned Layers. IEEE Trans. Magn. 35, 2568 (1999).

Ya, B. Bazaliy, B.A. Jones and Shou–Cheng Zhang. Modification of the Landau–Lifshitz Equation in the Presence of a Spin–Polarized Current in Colossal– and Giant–Magnetoresistive Materials. The American Physical Society, *Physical Review B*, vol. 57 No. 6, R3213–R3216, Feb. 1, 1998–II.

L. Berger. Emission of Spin Waves by a Magnetic Multilayer Traversed by a Current. The American Physical Society, *Physical Review B*, vol. 54 No. 13, 9353–9358, Oct. 1, 1996–I.

V.S. Speriosu, B.A. Gurney, D.R. Wilhoit, and L.B. Brown. Spin Valves with Synthetic Ferrimagnets. Presented at Intermag '96.

J.C. Slonczewski. Letter to the Editor: Current–Driven Excitation of Magnetic Multilayers. *Journal of Magnetism and Magnetic Materials*, 159 (1996) L1–L7.

M.I. D'yakonov and V.I. Perel'. *A.F. Ioffe Physico–technical Institute, USSR Academy of Sciences*, ZhETF Pis. Red. 13, No. 11, 657–660, Jun. 5, 1971.

* cited by examiner

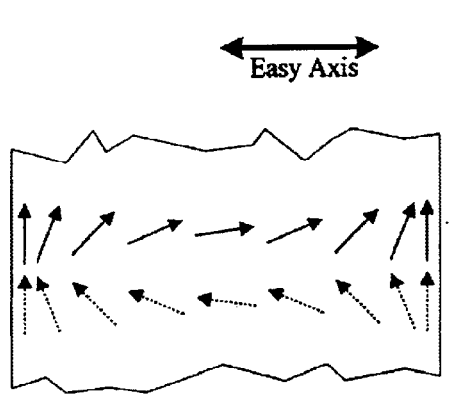
Fig. 6I
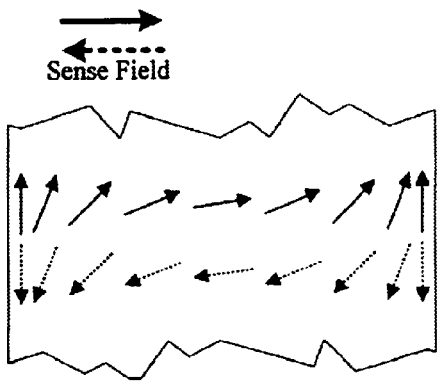
Fig. 6J
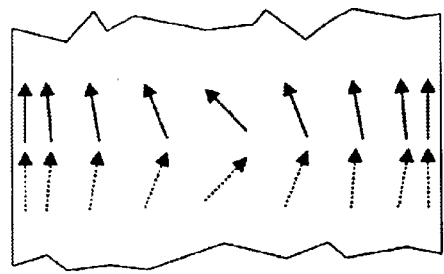
Fig. 6G
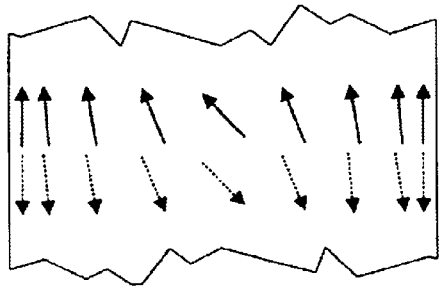
Fig. 6H
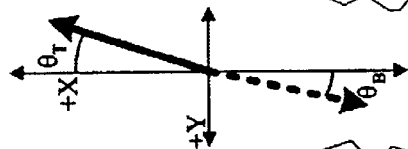
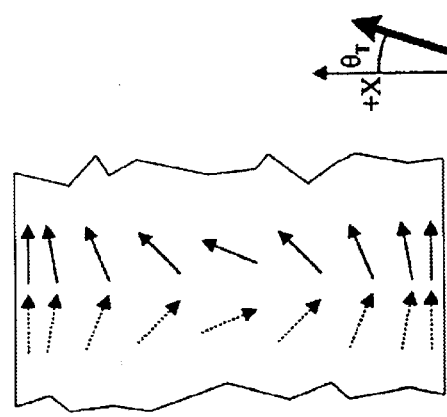
Fig. 6E
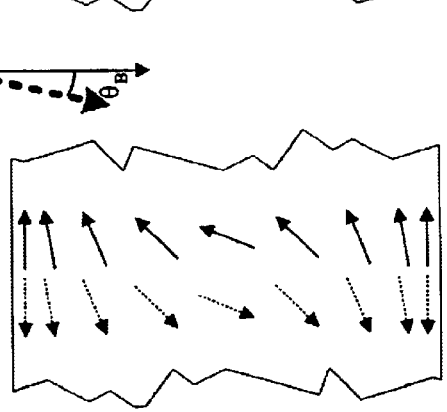
Fig. 6F
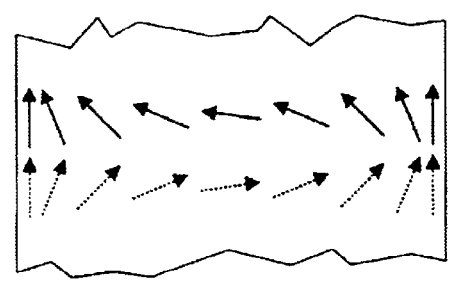
Fig. 6C
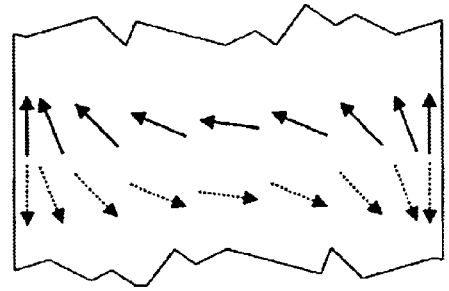
Fig. 6D

ANTIPARALLEL MAGNETORESISTIVE MEMORY CELLS

CROSS-REFERENCE TO RELATED APPLICATION

This application claims the benefit of Provisional Application No. 60/316,640 filed Aug. 31, 2001 for "ANTIPARALLEL MAGNETORESISTIVE MEMORY CELLS".

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and a low power dissipation memory through use of a cell structure that has a spin dependent tunneling junction (SDTJ), or magnetoresistive tunnel junction (MTJ), device therein based on a pair of ferromagnetic thin-film layers having an electrical insulator layer therebetween of sufficient thinness to allow tunneling currents therethrough. This memory cell can be fabricated using ferromagnetic thin-film materials of similar or different kinds in each of the magnetic memory films present in such a "sandwich" structure on either side of an intermediate nonmagnetic layer where such ferromagnetic films may be composite films, but this intermediate nonmagnetic layer conducts electrical current therethrough based primarily on the quantum electrodynamic effect "tunneling" current mentioned above.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance or conductance characterizing this intermediate layer with respect to the "tunneling" current therethrough. In addition, an antiferromagnetic layer against one of the ferromagnetic layers is used in such a cell to provide different magnetization switching thresholds between that ferromagnetic layer and the other by fixing, or "pinning", the magnetization direction for the adjacent ferromagnetic layer while leaving the other free to respond to externally applied fields. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

An example of a two state magnetoresistive device structure that is generally common to both of these kinds of memory cells is the "pinned sandwich" structure shown in the layer diagram of FIGS. 1A and 1B where the section line of FIG. 1B defines the view shown in FIG. 1A. This layer diagram gives an indication of the structural layers, but is not a true cross section view in that many dimensions there are exaggerated or reduced relative to one another for purposes of clarity.

A substrate, 2, supports an interconnection structure, 3, as the bottom contact electrode to a magnetic material (ferromagnetic material) free layer, 4, (meaning its magnetization is relatively free to be rotated to an alternative orientation) that is separated by a nonmagnetic material spacer layer, 5, from a magnetic material (ferromagnetic material) relatively fixed layer, 6, (meaning its magnetization is much less free to be rotated to an alternative orientation, i.e. "pinned"). This "pinning" of layer 6 is provided by a further magnetic material layer, 7, the "pinning" layer, that is of an antiferromagnetic material which is magnetically coupled to pinned layer 6 and thereby serves to make this two layer pinned structure relatively resistant to rotation of its initial joint magnetization direction in the presence of moderate external applied magnetic fields. An aluminum cap layer, 8, serves as the device top contact electrode providing a conductive path to a further interconnection, 9.

If spacer layer 5 is an electrical conductor, such as Cu, then the structure will exhibit the giant magnetoresistive (GMR) effect and be termed a "spin valve". If spacer layer 5 is an electrical insulator, such as $Al_2O_3$, that is sufficiently thin, then the device will exhibit the spin dependent tunneling effect and be termed a "magnetic tunnel junction". In either situation, the electrical resistance of the device is typically higher when the magnetizations of the free and fixed layers on either side of the spacer layer are oriented antiparallel to one another, and is lower when these magnetizations are oriented parallel to one another. The electrical resistance versus external applied magnetic field response characteristic for a spin valve that is measured for sense current being established across the magnetic material layers with the conductive layer therebetween is greater in terms of fractional change than that characteristic measured for the sense current established parallel to these layers because the entire collection of spins in the sense current electrons is forced to interact with both magnetic material layers for the sense current being established across these layers but only a fraction of these electrons interact with both layers for sense currents established parallel thereto.

Plots of the high externally applied magnetic field range and the low externally applied magnetic field range response characteristics of a typical spin valve are shown in the graphs of FIGS. 2A and 2B, respectively. The device resistance versus externally applied magnetic field response characteristics of a magnetic tunnel junction are qualitatively similar. However, the magnitudes of the resistance values and the resistance change values may be quite different. FIG. 2B shows that at moderately high positive externally applied magnetic fields the device resistance is largest, corresponding to the antiparallel alignment of the magnetizations of free and fixed layers 4 and 6; and the device resistance is smallest for moderately high negative externally applied magnetic fields, corresponding to the parallel alignment of the magnetizations of free and fixed layers 4 and 6.

As stated above, operating magnetic fields imposed externally can be used to vary the angle of the magnetization vector with respect to the easy axis in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells thereby giving rise to such magnetic fields so that selection of a cell occurs through coincident presences of such fields at that cell.

In such a coincident current selection arrangement, only that cell in the vicinity of the crossing location, or intersection, of these two paths experience sufficient magnetic field intensities due to the summing of the fields due to these two currents to cause such a magnetic state change therein. Cells in the array that are located far away from both of these two current paths are not significantly affected by the magnetic fields generated by such currents in the paths because such fields diminish in intensity with distance from the source thereof. Cells, however, located in relatively close proximity to one, but not two, of these two paths do experience more significant magnetic fields thereabout, and those immediately in or adjacent to one such path experience sufficient field intensities to be considered as being "half-selected" by the presence of current in that path intended to participate in fully selecting a different cell along that path at the intersection with the other path on which a selection current is present. Half-selection means that a bit is affected by magnetic fields from the current through one path but not another. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

As such magnetic thin-film memory cells are made smaller to thereby increase the cell density over the surface of the substrate on which they are disposed, the resulting cells become more subject to magnetic state, or data, upsets due to thermal fluctuations occurring in the materials therein. The depth of the energy well in the magnetic material of such cells can be approximated as $H_{weff} * M_s *$ Volume, where $H_{weff}$ is half the effective restoration magnetic field attempting to maintain the current magnetic state following perturbations thereto and so effectively providing the energy well depth, $M_s$ is the saturation magnetization of the magnetic material in the cell, and Volume is the volume of the magnetic material in the cell. In conventional cells, $H_{weff}$ is provided by shape anisotropy or anisotropy due to the material properties of the cell magnetic material, or both. Typically, the value of $H_{weff}$ in these cells is less than 100 Oe.

Plotting the magnetostatic energy of a data storage cell magnetic material layer versus the angle between the magnetization and the easy axis of that layer, an energy minimum is seen in the result at the angular value of zero or, with this angle designated as θ, at θ=0 as shown in the graph of FIG. 3. This minimum, having on either side thereof in this plot an energy maximum, that is energy maxima at θ=+90° and θ=−90°, is the "energy well". The depth of the energy well when no external magnetic fields are applied is simply the difference between the energy minimum and maxima. The value of this energy well can be calculated as follows:

$$E = \tfrac{1}{2}\sin^2\theta |\vec{M}| H_k V$$

where $\vec{M}$ is the magnetization, $H_k$ is the anisotropy field, V is the volume, and θ is the angle of $\vec{M}$ from the easy axis. The magnetization orientation will tend to orient to minimize the magnetostatic energy; i.e., θ will tend toward zero degrees.

The graph of FIG. 4 shows a Stoner-Wohlfarth switching threshold plot, a portion of an asteroid, and reasonable values of the word and sense fields to provide adequate margins for a memory employing coincident current selection. The solid curve in the figure represents the total field required to cause a bit magnetization to switch from one to the other of two stable states. The total field is the vector sum of the word magnetic field $\vec{H}_w$ due to current provided in an adjacent word line, and the sense magnetic field $\vec{H}_s$ due to current provided through the cell which currents are typically applied along current paths following the two orthogonal axes in the plane of the cell array. The Gaussian curve portion shown in the middle of the plot is representative of the distribution of cell applied magnetic field switching threshold values in an array of real memory cells. The memory array design, then, must account for the varying cell switching thresholds encountered in view of this distribution. As illustrated in the figure, design values for the word and sense fields are about ½ the value of $H_k$. The remaining energy well depth of those cells half-selected is about ¼ their non-selected depth. This can be shown through calculating the well depth with half selection magnetic fields both present and absent.

The energy expression above, when modified to include the effects of $\vec{H}_w$ and $\vec{H}_s$, becomes $$E = \tfrac{1}{2}\sin^2\theta |\vec{M}| H_k V - |\vec{M}||\vec{H}_s| V \sin\theta + |\vec{M}||\vec{H}_w| V \cos\theta$$

Here we assume that $\vec{H}_w$ is parallel to the effective easy axis while $\vec{H}_s$ is perpendicular to this axis. The easy axis is parallel to $H_k$.

If a half-select word field is applied (i.e. $|\vec{H}_w| = \tfrac{1}{2} H_k$ and $|\vec{H}_s| = 0$), the energy expression becomes:

$$E = \tfrac{1}{2}\sin^2\theta |\vec{M}| H_k V + |\vec{M}||\vec{H}_w| V \cos\theta,$$

where the second term is the energy due to the applied word field. If a half-select sense field is applied (i.e. $|\vec{H}_s| = \tfrac{1}{2} H_k$ and $|\vec{H}_w| = 0$), the energy expression becomes:

$$E = \tfrac{1}{2}\sin^2\theta|\vec{M}|H_kV - |\vec{M}||\vec{H}_s|V\sin\theta,$$

where the second term is the energy due to the applied sense field.

These two equations are plotted in the graphs of FIGS. 5A and 5B. In both cases, the well depth has been reduced by a factor of four, from $\tfrac{1}{2}MH_kV$ to $\tfrac{1}{8}MH_kV$. A physical memory may be designed with slightly different parameters. However, the important factor is the smallest energy well depth for a half-selected cell. The design objective is to ensure that the memory cells are magnetically stable during the data storing, or magnetic state switching, procedure that is repeatedly undertaken with respect to other cells. However, the trade-off between thermal stability and magnetic stability is a serious problem when the total magnetic volume of bits is less than about $10^5$ nm$^3$.

A ferromagnetic layer and an antiferromagnetic layer can be deposited in succession so they are in contact with one another with the result that relatively large interatomic forces occur aligning electron spins (parallel for ferromagnetism and antiparallel for antiferromagnetism). These coupling forces at the interface between these layers can be such that the magnetization of the ferromagnetic layer is restored to its initial direction prior to being subjected to external magnetic fields even after very large external magnetic fields are subsequently applied thereto. Such external magnetic fields can be 1000 Oe or more, and the magnetization of the ferromagnetic layer will still be restored to its initial direction. Thus, if such an antiferromagnetic layer is provided in contact with a ferromagnetic layer in a memory cell so that relatively large coupling occurs therebetween, the energy well depth for a small memory cell can be greatly increased. Such an arrangement can increase the potential density of memory cells by more than a factor of 10 through permitting the cell dimensions to go from about 0.2 µm minimum dimensions to approximately 0.05 µm dimensions.

A film structure which exhibits even better resistance to the effects of large externally applied magnetic fields is provided by a compound ferromagnetic thin-film layer with an antiferromagnetic layer. This compound ferromagnetic thin-film layer is provided to have a net layer magnetization that, when fixed in orientation in the finally formed structure, will resist rotation of its magnetization so that the magnetization of this compound ferromagnetic thin-film layer will appear fixed in its orientation in the device, i.e. "pinned" in a direction relative to the finally formed structure.

This compound ferromagnetic thin-film layer is formed by depositing a ferromagnetic layer to perhaps a thickness of 40 Å which is deposited in the presence of an easy axis direction determination magnetic field, then a nonmagnetic layer of ruthenium (no orienting magnetic field needed in this instance) to provide a Ru antiferromagnetic coupling layer of 9 Å thickness. Thereafter, another ferromagnetic layer is deposited to a thickness of 40 Å again in the presence of an easy axis direction determination magnetic field aligned as was the field for the first ferromagnetic layer. The resulting compound ferromagnetic layer has materials with high spin polarization in its outer layers due to the use of high magnetic induction ferromagnetic material therein, but has little net magnetic moment because of the Ru layer provided therebetween which strongly antiferromagnetically couples these outer layers through primarily exchange coupling (some magnetostatic coupling also present)so that the magnetizations of each are pointed in opposite directions. Thus, this layer is relatively insensitive to externally applied fields and contributes little to the spatial fields thereabout. However, the magnetization direction in this composite layer by itself is not very strongly fixed in any direction because of the relatively weak anisotropy exhibited by the ferromagnetic layers.

Thus, a further antiferromagnetic material "pinning" layer exhibiting a substantial magnetic anisotropy must be deposited on the last ferromagnetic layer to strongly set the magnetization direction of the compound layer. Such an antiferromagnetic layer has a strongly fixed magnetization direction which, through exchange coupling to the last ferromagnetic layer on which it is deposited, strongly fixes the direction of magnetization of that layer also, and so that of the first ferromagnetic layer through the Ru layer. The result is an antiferromagnetic layer coupled strongly to the compound layer. Hence, an antiferromagnetic pinning layer is deposited on the last ferromagnetic layer to a thickness of 100 Å or more in the presence of a magnetization axis determination magnetic field aligned with the fields used in forming the two ferromagnetic layers.

If this compound ferromagnetic layer with the antiferromagnetic layer thereon is provided across an electrically conductive layer of perhaps 25 Å thickness from a further ferromagnetic layer of again 40 Å thickness, a good "spin-valve" magnetoresistive memory cell is formed in which this last ferromagnetic layer is the "free" layer which can have its magnetization changed to be either parallel or antiparallel to the firmly fixed magnetization direction of the nearest ferromagnetic layer in the compound ferromagnetic layer to select one of the possible the cell magnetization states (the different states resulting in different cell electrical resistances). This can be accomplished through providing a sufficiently large storage electrical current which will flow primarily through the relatively thick conductive layer between the compound ferromagnetic layer and the "free" layer (although some of this current will also pass through these latter two layers also even though being substantially shunted around by the conductive layer). An external magnetic field directed along the storage current path can also be provided through an appropriately positioned current strap to "tip" the magnetization of the "free" layer to reduce the magnitude needed for the storage current to rotate the "free" layer magnetization. A smaller retrieval electrical current can be directed along the cell current path used for the storage current primarily through the conductive layer between the compound ferromagnetic layer and the "free" layer (though again some of this current will also pass through these latter two layers also despite the substantial conductive layer shunting effect).

This common use of the compound ferromagnetic layer with an antiferromagnetic layer thereon is based on its resistance to alteration of its magnetization direction by externally applied magnetic fields. Omitting the antiferromagnetic layer reduces the ability to set the direction of the magnetization in the compound ferromagnetic layer, but whatever magnetization direction results in the compound ferromagnetic layer in the circumstance of no antiferromagnetic layer being present is still, as indicated above, quite insensitive to externally applied magnetic fields if the two ferromagnetic layers therein are well matched in responding to such external fields. This is true since the effect of an external field on one ferromagnetic layer is directly opposed by the effect on the other because of their magnetizations being held strictly antiparallel to one another by the Ru layer therebetween. Thus, use of a compound ferromagnetic layer without an antiferromagnetic layer thereon would also result in the energy well depth for a small memory cell based on this structure being substantially increased due to the demagnetization fields in each ferromagnetic layer being maintained in directions to approximately cancel one another.

On the other hand, structures based on two ferromagnetic layers with a thin layer of Ru positioned therebetween would seem unsuited to serve as the storage structure for a memory cell because external magnetic fields of magnitudes reasonably generated by currents available in a memory cell array (several tens of Oe) fabricated with monolithic integrated circuit fabrication methods cannot cause such a structure to have the ferromagnetic layers therein switch their magnetizations between alternative magnetization directions (resulting upon removal of those external fields). That is, such fields will not cause switching between alternative magnetic states as ways of representing alternative stored values, typically binary values. However, such a storage structure is desirable if switchable because of the absence of demagnetizing fields therein due to the maintained antiparallel magnetizations in the ferromagnetic layers thereof.

BRIEF SUMMARY OF THE INVENTION

The present invention provides a ferromagnetic thin-film based digital memory having a plurality of bit structures electrically interconnected with information storage and retrieval circuitry. Each of these bit structures formed of a relative orientation maintenance intermediate layer having two major surfaces on opposite sides thereof with a pair of memory films of an anisotropic ferromagnetic material each on a corresponding one of said relative orientation maintenance intermediate layer major surfaces. The relative orientation maintenance intermediate layer is of a material and a selected thickness so as to maintain magnetizations of said memory films oriented in substantially opposite directions. The pair of memory films have magnetic moments sufficiently similar to each other so as to substantially maintain a magnetization state, or magnetization orientation primarily aligned with one easy axis direction in the films, despite magnetic fields occurring thereabout due to changes of magnetization states, or magnetization orientations from being aligned in primarily in one direction along the film easy axis to being aligned primarily in the opposite direction, of those said pairs of memory films in others of the plurality of bit structures when being operated or directed to do so by the information storage and retrieval circuitry. Interconnection electrodes pairs are each in electrically conductive contact with a corresponding one of the bit structures on substantially opposite sides thereof near or at substantially opposite edges of the relative orientation maintenance intermediate layer major surface with at least one member of a said interconnection electrode pair being electrically coupled to said information storage and retrieval circuitry. A magnetization reference direction layer, able to maintain relatively well its magnetization orientation, can be provided across a nonmagnetic layer from one of the pair of memory films with the nonmagnetic layer being either electrically conductive or insulative.

In a further embodiment, there is provided another ferromagnetic thin-film based digital memory having a plurality of bit structures electrically interconnected with information storage and retrieval circuitry. Each of these bit structures formed of a relative orientation maintenance intermediate layer having two major surfaces on opposite sides thereof with a memory film of an anisotropic ferromagnetic material on each of said relative orientation maintenance intermediate layer major surfaces. The relative orientation maintenance intermediate layer is of a material and a selected thickness so as to maintain magnetizations of said memory film, adjacent each of said intermediate layer major surfaces, oriented in substantially opposite directions. A nonmagnetic intermediate layer of an electrically insulative material is provided on the memory film across from one of the relative orientation maintenance intermediate layer major surfaces with the nonmagnetic intermediate layer having a major surface on a side thereof opposite the memory film. A magnetization reference layer is on the major surface of the nonmagnetic intermediate layer having a substantially fixed magnetization direction. Interconnection electrodes pairs are each in electrically conductive contact with a corresponding one of the bit structures on substantially opposite sides thereof near or at substantially opposite edges of the relative orientation maintenance intermediate layer major surface with at least one member of a said interconnection electrode pair being electrically coupled to said information storage and retrieval circuitry.

BRIEF DESCRIPTION OF THE DRAWINGS

FIG. 9 represents a graph of the state switching characteristic of the structure on which

DETAILED DESCRIPTION

Switching methods alternative to those based on primarily externally generated switching magnetic fields have been found for use in causing the switching of the magnetizations of the ferromagnetic layers between alternative magnetization directions in such a maintained antiparallel magnetization "sandwich" structure in which those layers are positioned on either side of an antiparallel magnetizations maintaining intermediate layer thereby allowing this arrangement to serve as the storage or bit structure for a magnetoresistive memory cell. One such method operates by establishing a storage electrical current in one direction or the other (depending on which of the two magnetization states is desired to be stored therein) between the ends of this structure that determine its length which will flow mostly in the two ferromagnetic layers because of the thinness of the intermediate ruthenium layer. The magnetic fields which result from such storage currents has the portion thereof in one of the ferromagnetic layers oriented primarily in one direction along its width, and the portion thereof in the other one of the ferromagnetic layers oriented primarily in the opposite direction along its width (the ferromagnetic layers easy axes are assumed to be along the layer widths). Thus, the magnetizations of the two ferromagnetic layers in this circumstance are each affected by a magnetic field in a direction opposite to the magnetic field affecting the other, in contrast to an externally applied magnetic field which would affect the magnetizations of these two layers in the same direction, and so such a storage current magnetic field can cause these magnetizations to switch directions.

Figure 6A:
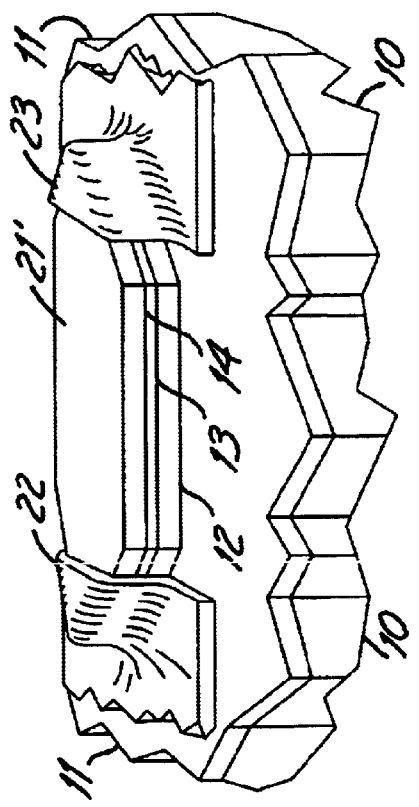
FIGS. 6C, 6E, 6G, and 6I show magnetizations under various conditions of portions of previously known structures in top views.
FIGS. 6D, 6F, 6H and 6J show magnetizations under various conditions of portions of the structures in FIGS. 6A and 6B in top views.

A suitable structure for this purpose is shown as a portion of a monolithic integrated circuit chip with protective layers omitted in the perspective view of FIG. 6A and is a composite film structure consisting of two ferromagnetic film layers separated by a material which provides for very large antiparallel coupling between the magnetizations in the two ferromagnetic film layers. The two ferromagnetic film layers are each a permalloy, or NiFeCo, film layer of 40 Å thickness separated by a ruthenium film of 9 Å thickness (significantly larger thicknesses will not result in strong antiparallel coupling of the two ferromagnetic layers). Such a composite film structure can provide the equivalent of more than 1000 Oe of antiparallel coupling between the magnetizations of the two ferromagnetic film layers as evidenced by the magnitude of the externally applied magnetic field found necessary to saturate the magnetizations of those two layers in the same direction.

If an orienting magnetic field is applied while these ferromagnetic film layers are being (sputter) deposited, there is a "field-induced" uniaxial anisotropy present in the magnetic films providing, subsequently, for a preferred orientation of the magnetizations in the absence of externally applied fields in either of two opposite directions along an "easy axis" in the film layers. Ion milling can be used to form the storage structure for a memory cell by milling away material from this composite film structure so that the easy axis in each remaining ferromagnetic layer portion forming the storage structure is along the structure width essentially perpendicular to the major length axis of that structure. The composite film structure is typically formed on a monolithic integrated circuit as base substrate, 10, in which memory array and memory cell operating circuitry can be provided, and on an insulating layer, 11, formed on base substrate 10 to complete the memory array substrate with layer 11 provided to electrically insulate the memory array from base substrate 10 except where circuit interconnections are subsequently made between the two. Ion milling of the composite film layer deposited on layer 11 to form a storage structure leaves a first ferromagnetic layer, 12, of permalloy separated by an antiparallel coupling layer, 13, of ruthenium (copper of a suitable thickness to provide antiparallel coupling could be used instead) from a second ferromagnetic layer, 14, again of permalloy, the thicknesses of each layer being given above.

Layers 12, 13 and 14 are shown to form a storage structure, 21, shaped as a rectangular solid in FIG. 6A because the use of a strongly antiparallel coupled storage structure reduces or eliminates magnetization "vortices" in the ferromagnetic layers of that structure which otherwise often occur near such "squared off" ends in similar but less strongly coupled structures in the form of a spiral shaped swirl in the vector field representation of the layer magnetization near such structure end locations. This favorable result comes about because the internal demagnetizing fields of storage structure 21 are nearly eliminated because the ferromagnetic layer magnetizations are oppositely directed even as the ferromagnetic layers magnetizations directions are switched. These demagnetizing fields in similar but less strongly coupled structures have nucleated such vortices particularly those with "squared off" ends. Storage structures 21 with such ends allow for a somewhat higher memory cell density on the substrate supporting them. As previously stated, stray fields extending from weakly coupled storage structures are virtually eliminated in storage structure 21 because of this cancellation of internal demagnetizing fields.

Figure 6B:
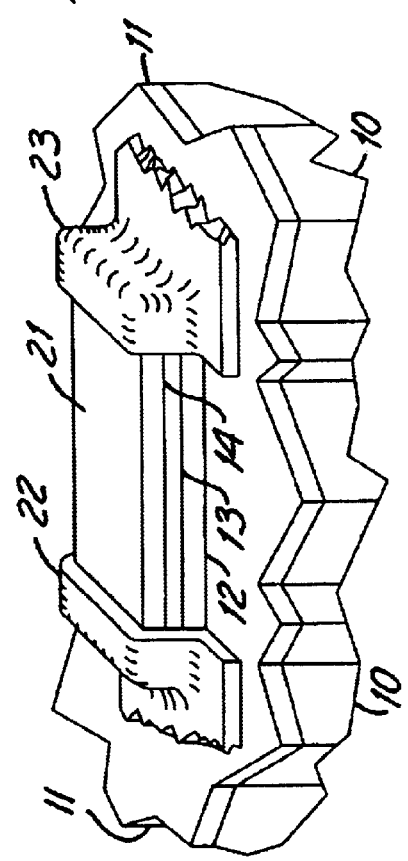

However, other shapes are useable for storage structure 21 including a storage structure, 21', having a shape with tapered, or triangular shaped, ends extending from the rectangular solid along its length which is shown as a portion of a monolithic integrated circuit chip with protective layers omitted in the perspective view of FIG. 6B. This shape, though having the result of somewhat reducing memory cell density, has often been used to prevent or reduce nucleation of vortices. A pair of electrical interconnection structures, 22 and 23, are on, and extend from the left and right ends, respectively, of storage structures 21 and 21'. Further structure portions will typically be provided in the memory cell final structure to permit information retrieval therefrom as will be described below though not shown here.

Storage structure 21 shown in FIG. 6A can, as indicated above, have the magnetization directions of the magnetizations of its ferromagnetic layers in a magnetically unperturbed state pointing in one direction along the layer easy axis switched to be pointing in the opposite direction by establishing an electrical current along the length of the storage structure to generate a magnetic field within that structure, this current being carried primarily by ferromagnetic layers 12 and 14 since antiparallel coupling layer 13 is so thin. This switching process is compared with the process of switching the magnetization directions of the magnetizations of the two weakly coupled ferromagnetic layers provided in the well known "giant magnetoresistive effect" storage structure which is same structure as shown in FIG. 6A except for the intermediate layer not being an antiparallel coupling layer but instead being an ordinary conductor such as copper around 25 Å thick. Such a comparison is made with the aid of FIGS. 6C, 6D, 6E, 6F, 6G, 6H, 6I and 6J in which successive magnetization directions in the two weakly coupled ferromagnetic layers are shown during a magnetization direction switching in an upper succession of top views of corresponding storage structure 21 as provided in FIGS. 6C, 6E, 6G and 6I, and in which successive magnetization directions in the two strongly antiparallel coupled ferromagnetic layers are shown during a magnetization direction switching in a lower succession of top views of the corresponding storage structure as provided in FIGS. 6D, 6F, 6H and 6J. The solid line arrows represent the upper ferromagnetic layer magnetization in each storage structure, and the dashed line arrows represent the lower ferromagnetic layer magnetization in each storage structure.

The magnetizations of ferromagnetic layers 12 and 14 in antiparallel coupled storage structure 21 in the upper succession of top views point down and up, respectively, in FIG. 6C prior to switching, and the magnetizations of the two ferromagnetic layers in weakly coupled storage structure in the lower succession of top views also point down and up, respectively, in FIG. 6D prior to switching. Rotation of these magnetizations to alternative orientations from these initial orientations through magnetic torques occurring thereon introduced through the presence of magnetic fields or effective magnetic fields thereat. Magnetic torque on the magnetization in an individual ferromagnetic material layer results from four such fields or effective fields. They are (1) the magnetic fields due to sufficiently nearby electric currents, (2) the magnetic fields effectively present because of the effective presence of "free poles" in these layers, (3) the effective anisotropy magnetic fields resulting from the magnetic anisotropies present in these layers, and (4) an effective "molecular field" resulting from the magnetic quantum exchange coupling between adjacent magnetic moments.

Large positive exchange coupling is the distinguishing feature of ferromagnetic materials. A positive exchange constant, A, indicates that it is energetically favorable for adjacent magnetic moments to be aligned parallel to each other. In this case, the antiparallel alignment is the highest energy configuration for adjacent moments. The form of this exchange energy between magnetic moments in conceptual adjacent thin sheets, in both antiparallel coupled storage structures and weakly coupled storage structures where such sheets extend along the length of such storage structures and perpendicular to the planes of the layers in those storage structures, is per unit sheet cross sectional area (for small angles $\phi$)

Exchange Energy=$E_{ex}$=$-A \cos(\phi) \approx -A(1-\phi^2)=A\phi^2+$Const.

where $\phi$ is the angle between two adjacent thin sheets of magnetic moments and the usual small angle approximation has been used for $\phi$. The general relationship between energy as a function of angle and torque is Torque=$\vec{T}=\vec{r}\times\vec{F}=\vec{r}\times[-\vec{\nabla}E]=-\vec{r}\times\vec{u}_\phi(d/|\vec{r}|)dE/d\phi=-\vec{u}_2(dE/d\phi)$.

Here $\vec{r}$ is the vector from the axis of rotation to the point of action, $\vec{F}$ is a force due to the gradient of a conservative energy field E, and $\vec{u}_r$, $\vec{u}_\phi$ and $\vec{u}_z$ are the three orthogonal unit vectors in cylindrical coordinates. Note that when calculating torque from the last equation by differentiating the exchange energy $E_{ex}$ as given in the equation preceding the last, the constant term in the exchange energy expression will be eliminated since the derivative of a constant is zero.

The torque on a magnetic moment from applied magnetic fields follows the general form Torque=$\vec{H}\times\vec{M}$, where $\vec{H}$ and $\vec{M}$ are vector representations of the applied filed and magnetic moment or magnetization. The result of this torque, as with mechanical torque, is an angular acceleration of the magnetic moment. When the magnetic state of a storage structure is in equilibrium, the total torque is zero, as is the total angular momentum.

In order to understand the rotation response to storage current and magnetic edge configurations, we use a "quasi-static" analysis of the torques on individual magnetic moments in a bit. The "quasi-static" means that the time dependence of the magnetic moment orientation is not considered. Rather, the angle $\theta$ of a given magnetic moment at position x within the bit is found by finding the configuration of moments across the bit width that results in zero net torque for all x.

Figures 7A, 7B:
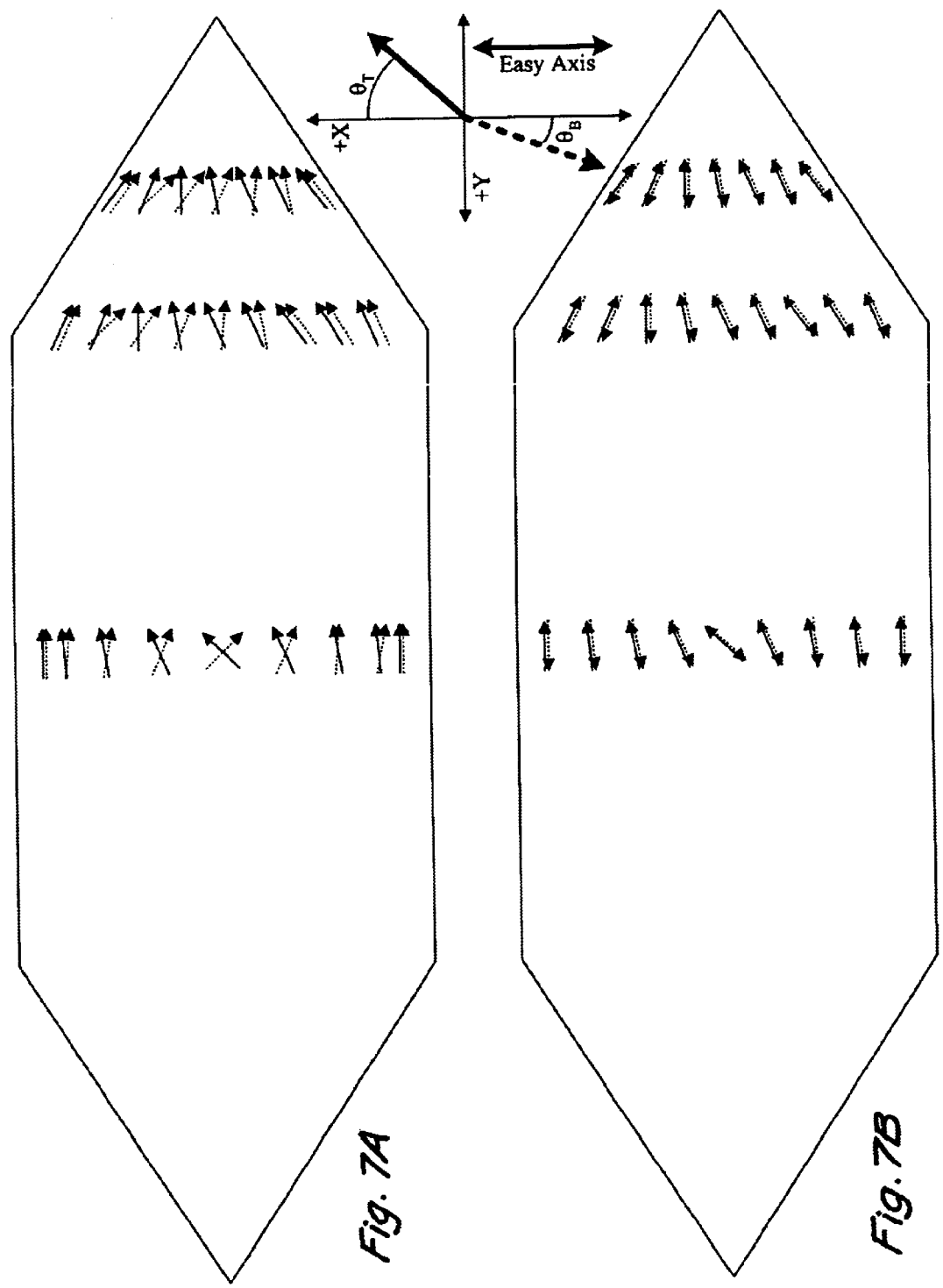
FIG. 7A shows magnetizations under various conditions in portions of a previously known structure in a top view of that structure, and 7B shows magnetizations under various conditions in portions of the structure in FIG. 6B in a top view of that structure, FIG. 8 represent a graph of the magnetization across the width in a central portion of the structures in FIGS. 6A and 6B under various conditions.

As shown for both the weakly coupled storage structure set out in a top view in FIG. 7A and the antiparallel coupled storage structure set out in a top view in 7B, these storage structures are arranged to have their lengths extend along the Y-axis of a corresponding Cartesian coordinate system (generally indicated nearby), their widths extend along the X-axis, and their thicknesses extend in the Z-direction (out of the page). The origin of the coordinate system pertinent to each storage structure is located at the center of that structure.

FIGS. 7A and 7B show the magnetization orientations of both the top and bottom ferromagnetic layers in the central regions of those storage structures with the solid line arrows depicting the magnetization orientation for the upper or top ferromagnetic layer and the dashed line arrows depicting the magnetization orientation for the lower or bottom ferromagnetic layer. The magnetizations of the edges of layers 12 and 14 in the antiparallel coupled storage structure are antiparallel to each other, while magnetizations of the corresponding edges in the weakly coupled storage structure are parallel to one another.

The following equation is a differential equation based model for either of these "sandwich" structures shown in FIGS. 7A and 7B obtained from the preceding magnetic torque equation which is seen to depend on a single spatial dimension, x. The equation assumes that the magnetization orientation does not change significantly as one moves in the Y-axis direction or in the Z-axis direction. The magnetization orientation change with respect to position, called "curling", occurs mostly as one moves along the X-axis direction in the plane of the ferromagnetic layers and is indicted by the angle $\theta_T$ with respect to the X-axis direction in the top ferromagnetic layer and by the angle $\theta_B$ with respect to the X-axis direction in the bottom ferromagnetic layer as indicated in the general Cartesian coordinate system shown in connection with these figures with there being one such coordinate system at the center of each structure. As one moves from the center of the bit to the edge in the X-axis direction, the magnetization orientation goes from near $\theta=0°$ or 0 radians to near $\theta=90°$ or $\pi/2$ radians.

This distribution of magnetization orientations can be demonstrated analytically by use of this following differential equation model for a storage structure ferromagnetic layer given as Torque = $-H_k M_s \sin\theta\cos\theta + |\vec{H}_w|M_s\cos\theta +$ $|\vec{H}_s|M_s\sin\theta + 2A\dfrac{d^2\theta}{dx^2} - \sin\theta 2\pi M_s^2 S'T\dfrac{d^2(\cos\theta)}{dx^2}$ where
- $H_k$=anisotropy field (assumed to be in the X-axis direction)
- $\vec{H}_w$=word field (assumed to be in the Y-axis direction)
- $\vec{H}_s$=sense field (X-axis direction)
- $M_s$=saturation magnetization (parallel to the magnetic moment)
- T=layer thickness
- S=antiparallel maintenance or weakly coupling layer thickness
- A=exchange constant θ=local angle of $\vec{M}$ S'=S+T/4=effective separation The factor S' is the effective separation of the two ferromagnetic layers in the storage structure "sandwich". The effective separation is somewhat greater than the actual physical separation of those layers, i.e. the thickness of the intermediate layer, because of the turning of the magnetic flux in one ferromagnetic layer toward the other at the long edges of the vertical sensor so as to have that field pass through the separation layer to the other. The effective separation is determined from $$S' = S + \frac{2}{\alpha} \frac{[\cosh(\alpha T/2) - 1]}{[\alpha T \cosh(\alpha T/2) - \sinh(\alpha T/2)]}$$

where $\alpha = \sqrt{4\pi M_s^2/2A}$.

Figure 8:
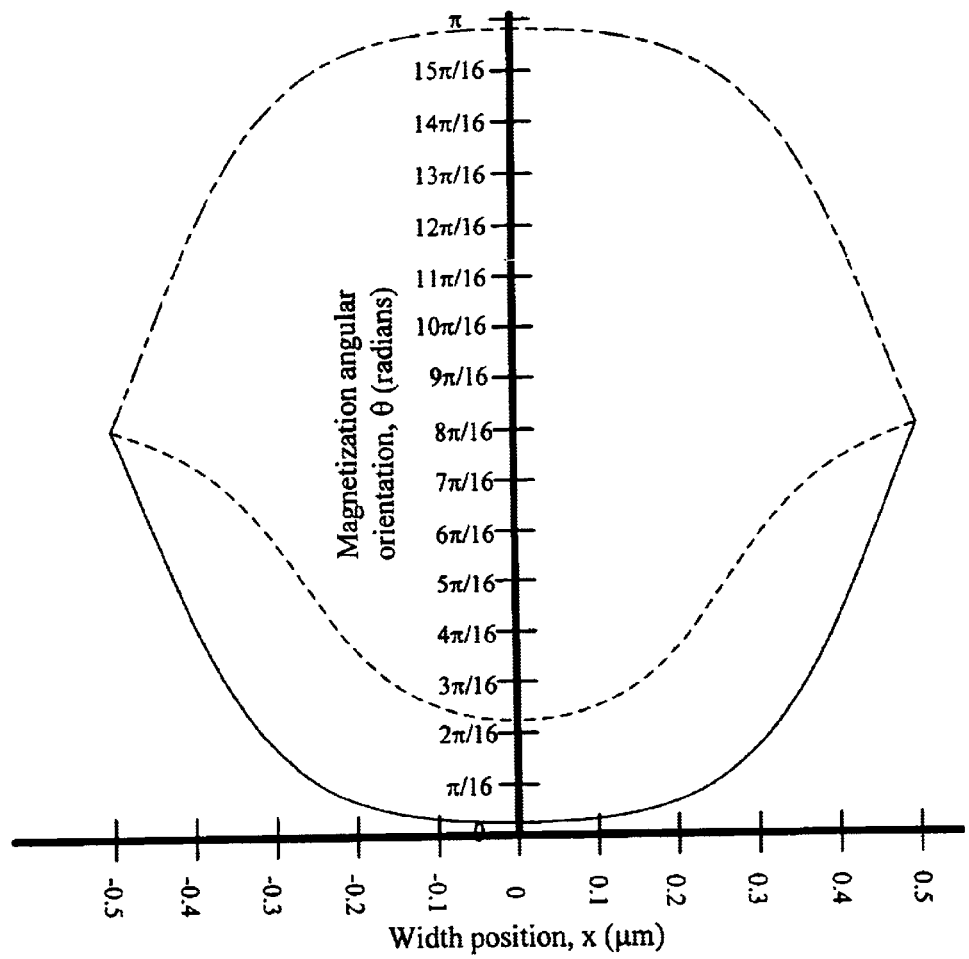
FIG. 8 is based.

This foregoing differential equation in x set to a torque value of zero allows finding the magnetization orientation at magnetic state equilibrium, but has no analytical solution so that the analysis must be performed numerically. The results of the analysis are shown graphically in FIG. 8. The three curves in FIG. 8 represent the magnetization orientation $\theta_T$ plotted against position x using the coordinate arrangement described above for the top ferromagnetic layer in a storage structure across the width of the storage structure at its center, i.e. at y=0. The solid line plot in FIG. 8 gives the magnetization orientation as a function of x position in the absence of a sense current in the storage structure as is shown in both FIGS. 6C and 6D. The consistent dash size line plot provides the magnetization orientation as a function of x in the situation in which there is a sense current along the length of the storage structure of a magnitude such that any additional sense current would cause the magnetization to switch to the opposite direction from its initial direction (indicating the effective switching threshold) as is shown in both FIGS. 6G and 6H. Finally, the alternate long and short dash size line plot shows the magnetization orientation as a function of x in the situation in which such a switching event has occurred as is shown in both FIGS. 6I and 6J.

FIG. 8 sets out the results for the calculated angular distribution of the magnetization based on a 1 μm wide "sandwich" storage structure with the following values for the different storage structure parameters:

$T$=50 Å, $H_k$=16 Oe, $M_s$=1000 emu, $A$=1.3×10$^{-6}$ ergs/cm, $S$=8 Å.

The required switching sense field is found to be $H_s$=6.65 Oe. The curling provides an equivalent word field of 4.75 Oe. For a simple Stoner-Wohlfarth threshold the required sense field would be 16 Oe. If the width of the "sandwich" storage structure is reduced to 0.7 microns, the required switching sense field is only 3.9 Oe and the curling provided equivalent word field is 7.6 Oe. At a width of 0.87 microns, the required switching sense field of 5.7 Oe and the equivalent curling provided word field are equal.

Figure 9:
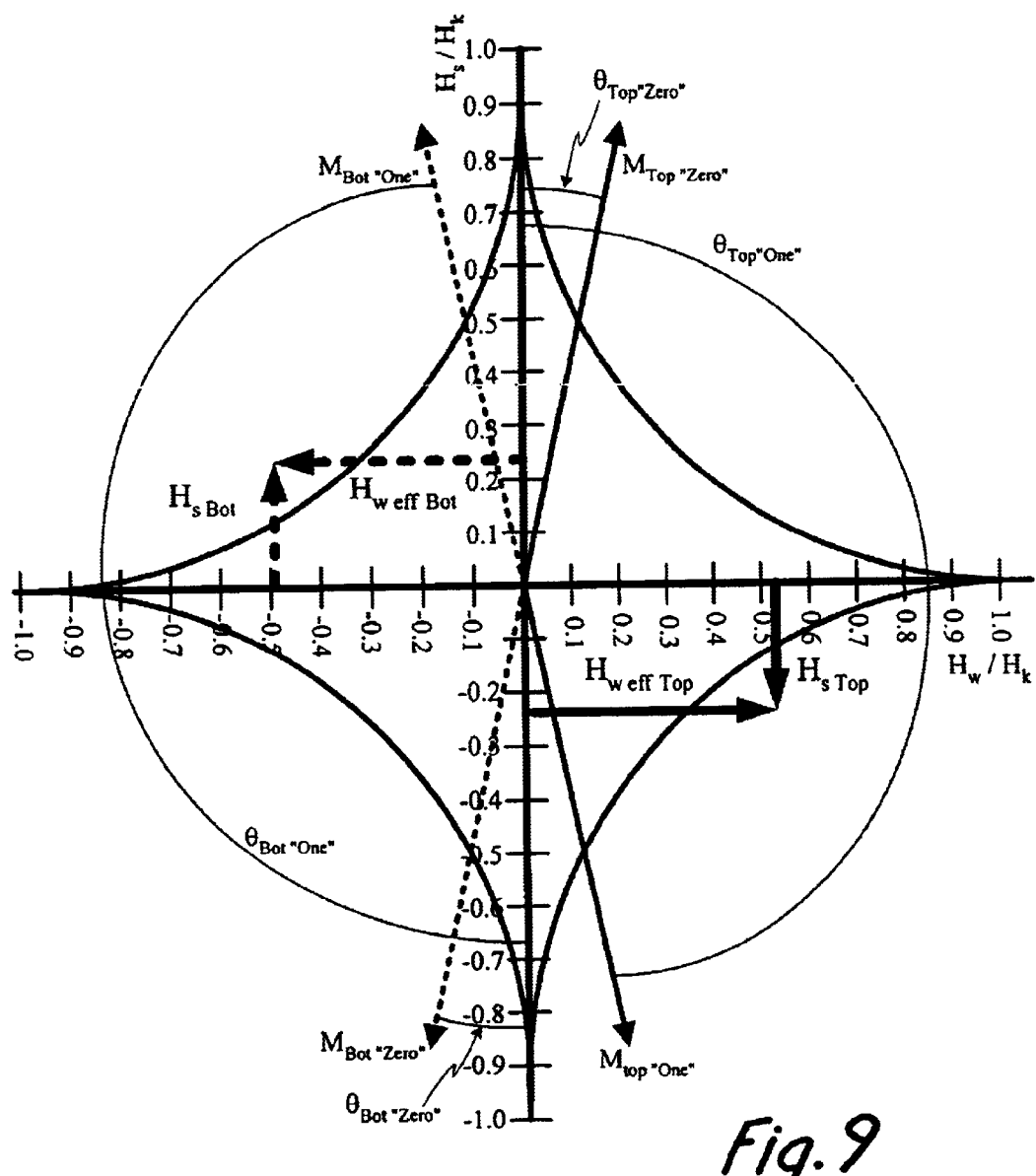

FIG. 9 shows the magnetic state switching characteristic as an asteroid for such a bit structure. The solid and dashed narrow line arrows represent the magnetization orientations of the top and bottom ferromagnetic layers, respectively. The first and second of each type of narrow line arrow represent the "zero" and "one" magnetic states. The solid and dashed bold or wide line arrows represent magnetic fields applied to the top and bottom ferromagnetic layers, respectively. $H_{w\text{-}eff}$ is an effective field resulting from the edge magnetization being fixed, while $H_s$ is supplied by applied sense current through the structure along its length. The bold arrows here are what would be required for switching from "zero" state to "one" state. The switching asteroid indicates the total magnetic field that will cause a switching between alternative magnetic states. The sum of $H_{w\text{-}eff}$ and $H_s$ vectors, then, must be outside the asteroid. Once a state switching event occurs, the $H_{w\text{-}eff}$ remains the same (the fixed edge magnetization is always there), but $H_s$ is removed (the sense current is turned off). $H_{w\text{-}eff}$ alone is always within the asteroid, and thus does not cause switching by itself. The "zero" state of the antiferromagnetically coupled structure has $\theta_{Top}$ and $\theta_{Bot}$ positive, but near zero, while the "one" state has $\theta_{Top}$ and $\theta_{Bot}$ positive near π.

FIGS. 6C through 6J shows the difference in switching behavior between antiferromagnetically coupled storage structures and weakly coupled storage structures. The top magnetic layer magnetizations (illustrated by the solid line arrows) are arbitrarily shown as initially pointed to the right along the long side edge portions of the structure layer portions shown in these figures for both types of coupling, and exchange coupling between these layer edge magnetization portions and the layer interior central portions in these upper ferromagnetic layers additionally causes the magnetizations of these more centered interior portions thereof to also tilt a bit to the right from the layer easy axis in this circumstance. During a switching sequence as illustrated from left to right in FIGS. 6C, 6E, 6G and 6I for the weakly coupled storage structure, and from left to right in FIGS. 6D, 6F, 6H and 6J for the antiferromagnetically coupled storage structure, the magnetizations of these upper layer portions always point to some degree to the right throughout the sequence. The bottom ferromagnetic layer of the antiferromagnetically coupled structure represented in FIGS. 6D, 6F, 6H and 6J consequently has its magnetization (illustrated by the dashed line arrows) in various portions thereof initially pointing to the left everywhere in the layer structure portion shown, and always pointing at least partly to the left during a switching sequence. On the other hand, the bottom ferromagnetic layer of the weakly coupled structure represented in FIGS. 6C, 6E, 6G and 6I has its magnetization (again illustrated by the dashed line arrows) in various portions thereof initially pointing to the right everywhere in the layer structure portion shown by the happenstance outcome of the fabrication process as indicated below, and always point at least partly to the right during a switching sequence because of this initial happenstance.

As long as there is no externally applied magnetic field due to current provided in a nearby electrical conductive "word line", the orientation of the magnetic moments at the storage or bit structure edges determines which of the right and left half-planes, extending parallel to the lengths and widths of the ferromagnetic layers in these storage or bit structures and bounded by the layer easy axis, will be the one in which the varying orientations of the magnetic moments in the structure ferromagnetic layers will be entirely contained during a switching sequence. This is because a provided sense current in the structure along the length thereof generates "sense magnetic fields" that are directed entirely along the widths of the bit structure ferromagnetic layers and never along the lengths thereof. The torques on the ferromagnetic layers magnetic moments resulting from applications of the sense magnetic field (represented by third term in torque differential equation above) are always such that the moments in the more centered interior regions of such a layer initially rotate towards the magnetization orientation at the edge of that layer until reaching the switching threshold at which point they rotate past the edge orientation to become nearly perpendicular thereto but antiparallel to the initial state.

In the weakly coupled bit structure shown here, the orientation of the magnetic moments in both layers are restricted to the same right half-plane because the edges of these layers in the "sandwich" structure thereof are parallel. In practice, the edge magnetizations orientations may occur either parallel to, or antiparallel to, one another, or both (in different regions thereof), due to the lack of control over the edge magnetizations orientations during the fabrication process resulting in such a storage or bit structure. Usually, orienting the edge magnetizations in both of the ferromagnetic layers in a weakly coupled storage structure to be parallel to one another is possible by applying a large magnetic field along the length of the structure, though sometimes require to occur in elevated temperature conditions. This edge conditioning may be desirable to provide a known bit structure magnetic state but affects both layers similarly to thereby orient those edge magnetizations in each layer in the same direction.

In contrast, in antiferromagnetically coupled storage structures, the edge orientations in the two ferromagnetic layers in the "sandwich" structure are almost certainly to be oriented antiparallel to one another due to the strong antiferromagnetically coupling mediated by the thin ruthenium layer therebetween. Antiferromagnetic coupling between the two ferromagnetic layers in such a "sandwich" structure is, then, a convenient way to get antiparallel edge magnetization states between these two layers, which in turn ensures that the magnetizations of these two layers rotate in opposite half-planes during switching sequences, thereby leading to the occurrence of much reduced demagnetizing fields in the end regions of the bits as can be seen in FIGS. 7A and 7B. If another method were available to create the antiparallel edge conditions, one could expect the switching to occur in opposite half-planes as for an antiferromagnetically coupled sandwich even if there was no direct exchange coupling between the layers.

The torque on a given magnetic moment from the magnetic material anisotropy is accounted for in the first term in the above differential equation for the torque on the magnetic moment in a ferromagnetic layer in a "sandwich" structure. Torque due to fields from electric currents (sense or internal currents and word line or external currents) are in the second and third terms. The exchange torque is accounted for in the fourth term, and the torque from fields due to free magnetic poles is represented in the fifth term.

The exchange torque term is derived differentiating the exchange coupling energy with respect to $\phi$, the angle between moments in adjacent sheets. Assuming the orientation of moments, $\theta(x)$, varies smoothly as a function of x, the angle $\phi(x)$ is given by $\phi(x)=\beta[d\theta/dx]$ where $\beta$ is the atomic spacing. Inserting this term into the equation for exchange energy $E_{ex}$ given above yields $$E_{ex}\approx -A\phi^2=-A\beta^2[d\phi/dx]^2$$

As taken from the general equation for torque first given above following the equation for exchange energy, the magnitude of the exchange torque between moments in two adjacent sheets is Exchange torque$°=d(E_{ex})/d\phi=-2A\phi=2A\beta[d\theta/dx]$.

The net torque on a magnetic moment in one sheet due to its exchange interactions with neighboring sheets is the sum of torques from the sheets on both sides, or net torque on sheet 2−torque from sheet 1+torque from sheet 3, giving $$T=T_1+T_2=-2A\phi_1-\{-2A\phi_2\}=2A(\phi_1-\phi_2)=\beta 2Ad\phi/dx=\beta^2 2Ad^2\theta/dx^2.$$

If $d\theta/dx$ is constant through this region, then $\phi$ is constant as seen from by $\phi(x)=\beta[d\theta/dx]$ given above, and so the torque exerted on the moment from one neighboring sheet is exactly cancelled by the torque exerted by the other sheet as seen from the equation last set out above. Thus, the second derivative must be nonzero for the net exchange torque to be nonzero.

The fifth term in the differential equation for torque above accounts for fields due to free magnetic poles built up at the bit structure edges. These free poles correspond to the demagnetizing fields occurring in the bit structure. In larger bit structures, the demagnetizing fields can be considered to be a uniform single value across the whole bit and accounted for as part of the effective anisotropy field. Here in structures of small extent, however, they are treated more accurately as a nonuniform local effect.

The free pole density at an edge is proportional to the rate of change of the magnetization there. These free poles are assumed to create a field in the direction parallel to the width of the bit structure. The magnitude in the x direction of the magnetization at a given position is $M_s \cos(\theta)$. The field due to local free pole density due to changes in the magnetization orientation angle $\theta$ near the bit edge moving from the center towards the edge are proportional to the second derivative, or $$|\vec{H}_{demag}(x,\theta)|=4\pi M_s S'T\, d^2(\cos(\theta))/d^2x.$$

S' is introduced to account for stray field coupling between the two layers, and is slightly larger than the actual layer separation. The torque due to this free pole field on the magnetization is thus $$\vec{H}_{demag}\times\vec{M}=-2\pi M_s^2 S'T \sin(\theta)d^2(\cos(\theta))/d^2x.$$

In switching the magnetizations directions in the weakly coupled storage structure, a "tipping" magnetic field directed along the length of the storage structure is used that is generated typically by electrical current provided in a current strap near the storage structure positioned across its width. This field is in addition to the magnetic field directed along the width of the storage structure provided by electrical carried through that structure in electrical interconnections 22 and 23.

The result of such a "tipping" field can be effectively seen in FIG. 6E for a "tipping" field directed to the right where the magnetizations of two ferromagnetic are rotated toward the right with each magnetization rotating in a direction opposite to the other. The magnetic field generated by the storage current carried by electrical interconnections 22 and 23 continues the rotations of the ferromagnetic layer magnetizations in the same directions initiated by the "tipping" field, as shown in FIG. 6G, to thereby result in a reversed magnetization state in this storage structure as shown in FIG. 6I.

The effect of edge demagnetizing fields is primarily to cause "curling" of the magnetization near the edges of the ferromagnetic layers. In some cases, this curling provides sufficient effective torque to replace the function of the externally applied "tipping field".

Figure 1B:
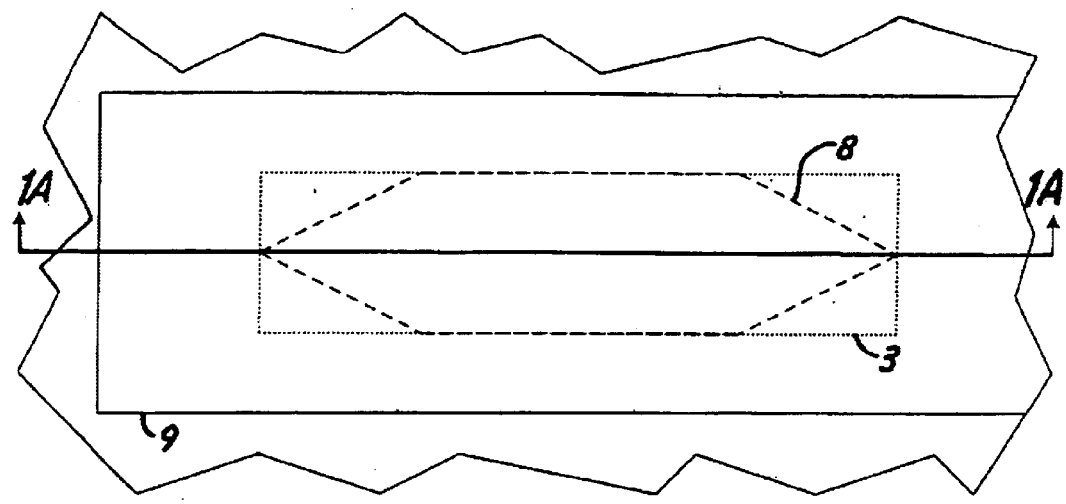
FIGS. 1A and 1B represent a layer diagram of a portion of a prior art monolithic integrated circuit structure.
Figure 1A:
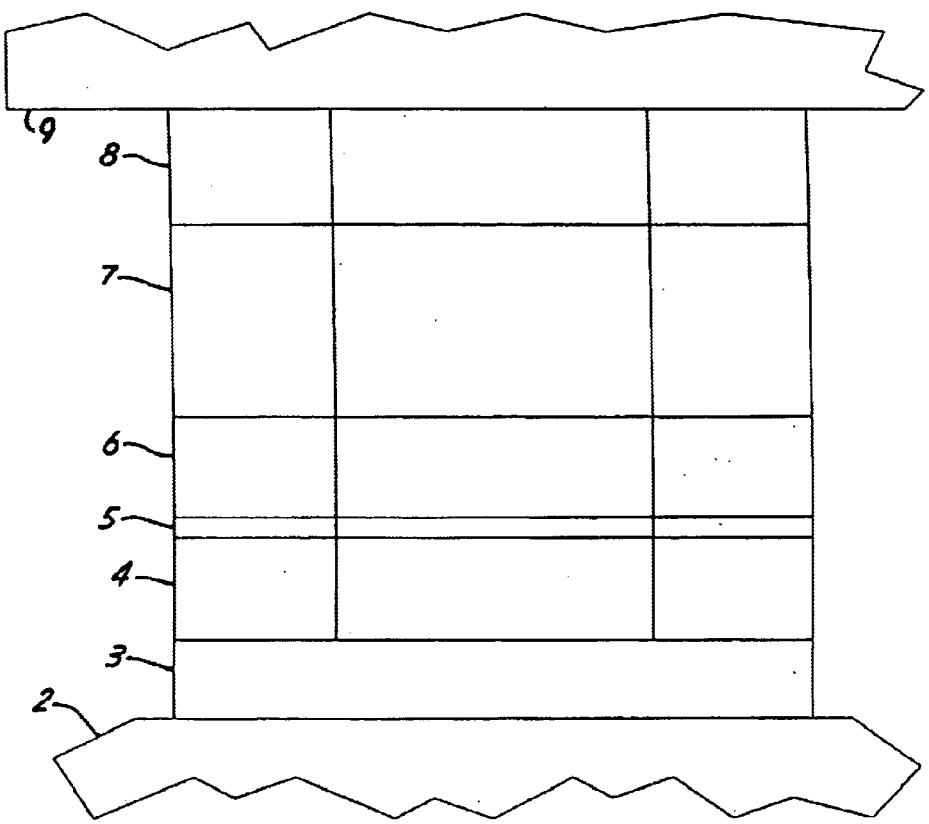
Figure 2A:
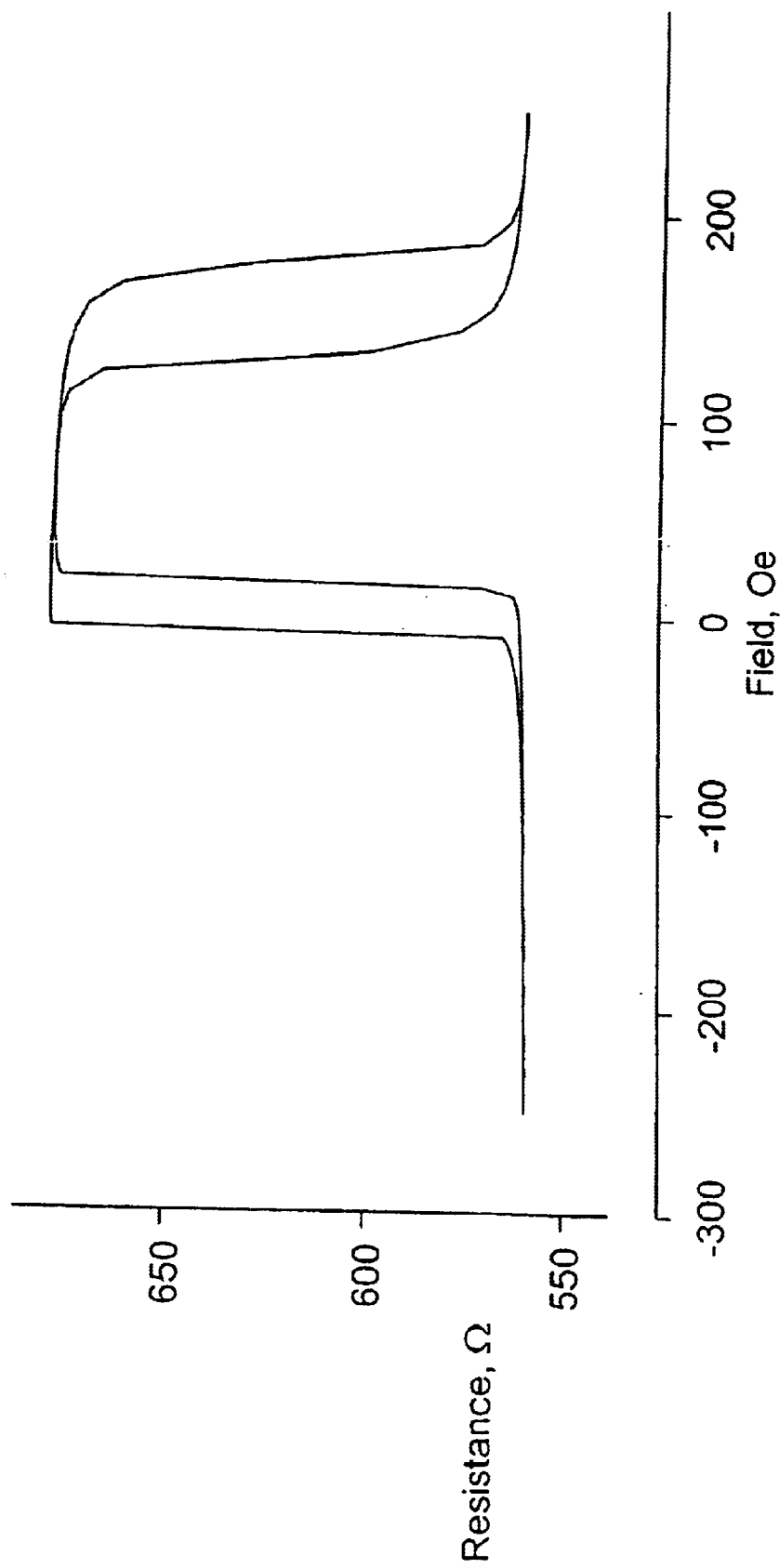
FIGS. 2A and 2B represent graphs of a response for a structure similar to one of those prior art structures shown in FIGS. 1A and 1B and for other structures herein.
Figure 2B:
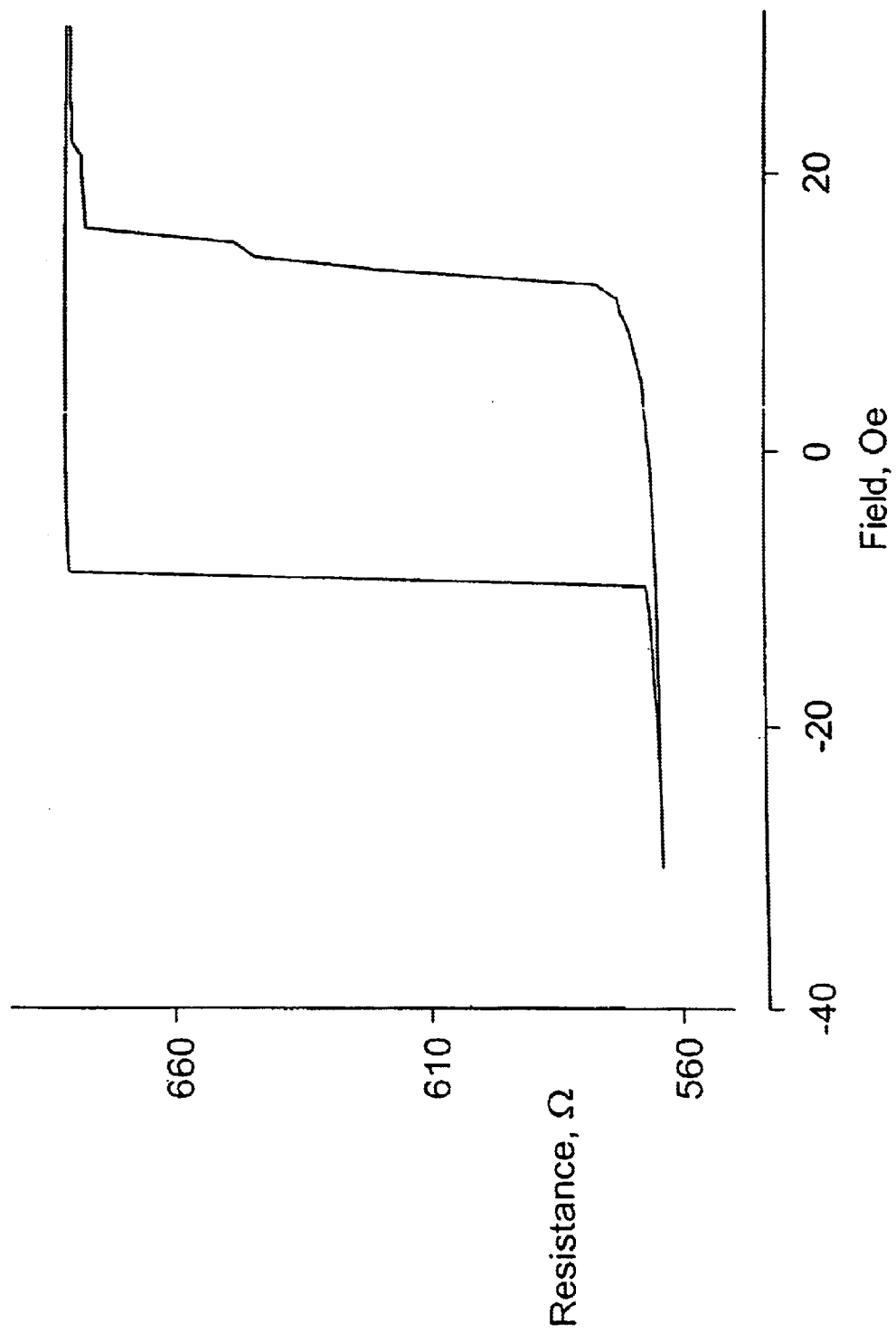
Figure 3:
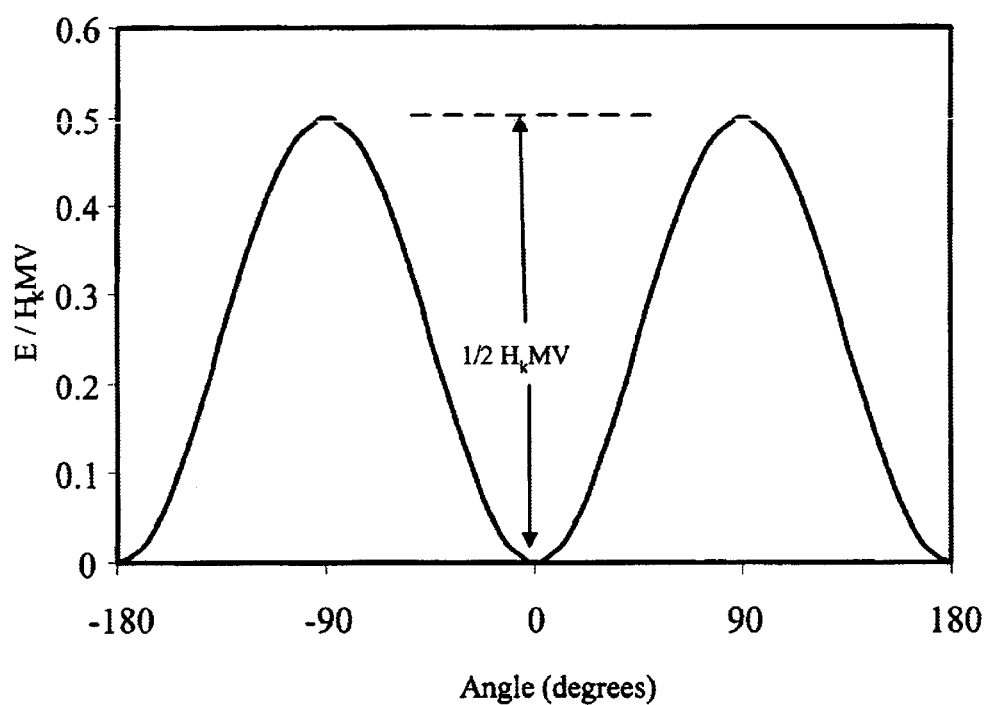
FIGS. 3, 4, 5A and 5B represent graphs of conditions and responses for structures similar to those prior art structures shown in FIGS. 1A and 1B, FIGS. 6A and 6B show perspective views of structures embodying the present invention.
Figure 4:
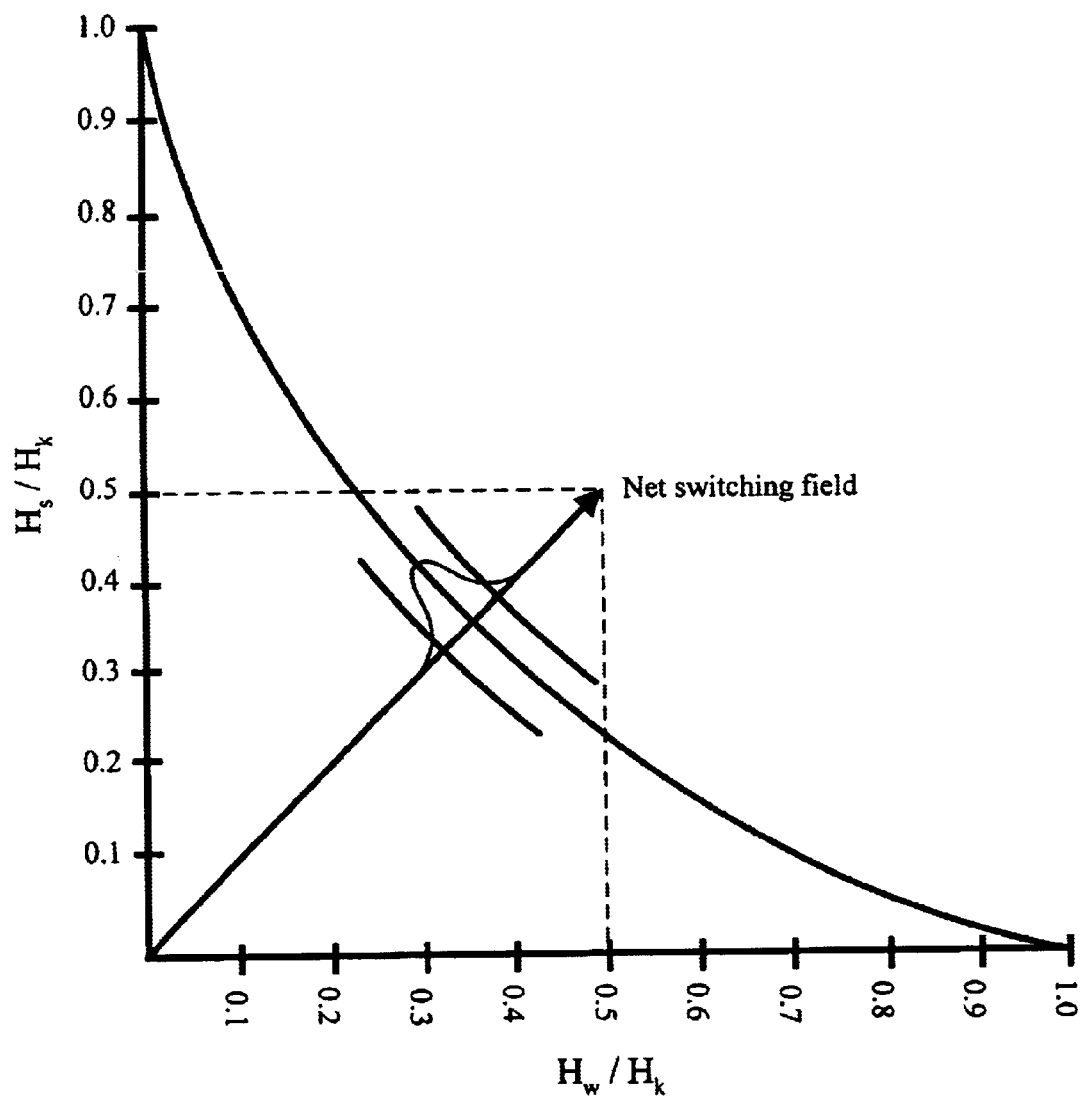
Figure 5A:
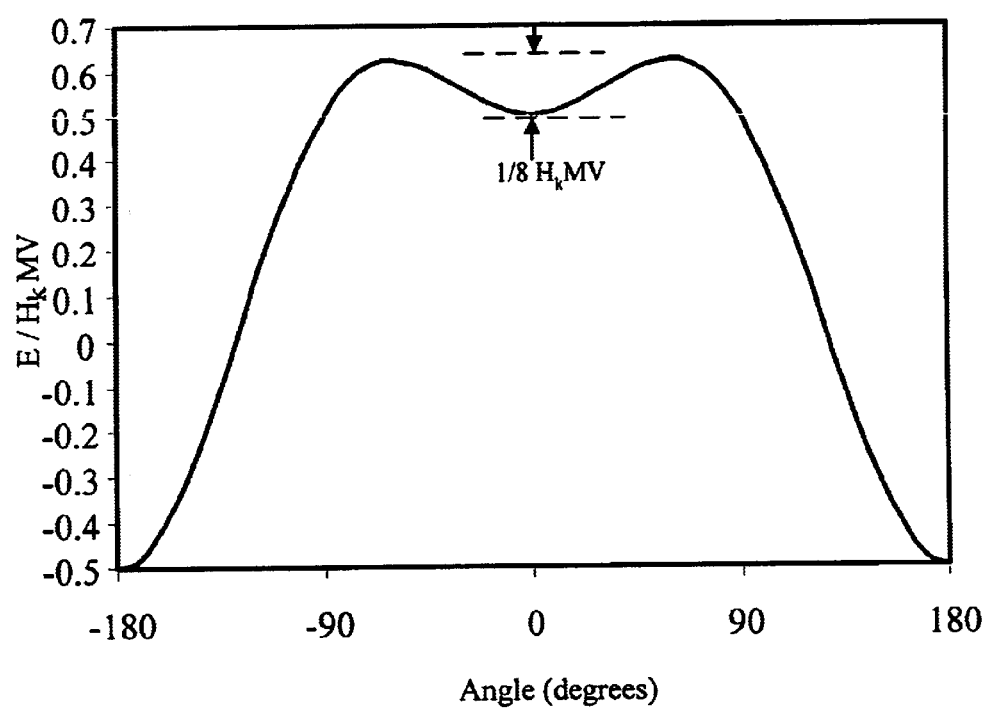
Figure 5B:
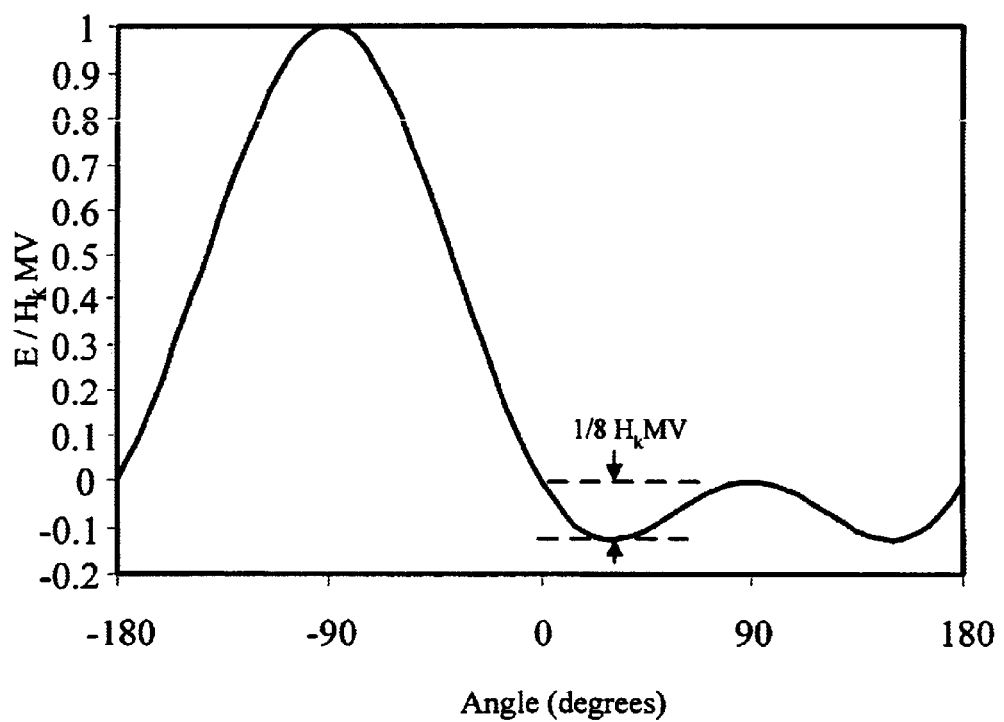

Just the storage current in storage structure 21 carried by electrical interconnections 22 and 23 is used to switch the ferromagnetic layers magnetizations directions in antiparallel coupled storage structure 21. External fields cannot assist in this switching process because of the insensitivity of storage structure 21 to externally applied magnetic fields as described above. The magnetizations of ferromagnetic layers 12 and 14 stay antiparallel, and rotate in a common direction, as shown in FIGS. 1F and 1H, until the magnetization state of storage structure 21 is reversed as shown in FIG. 1J. Just which direction the ferromagnetic layers magnetizations will rotate to reach the final reversed state position may depend on various initial conditions and be unpredictable—both could rotate clockwise or both could rotate counterclockwise. Skewing the easy axes of the ferromagnetic layers to some significant angle with respect to the perpendicular to the storage structure length is possible as a way of predetermining the rotation direction if desired. A significant angle might be 10 degrees to 45 degrees. In that case, the rotation directions of the magnetizations would be predetermined, either both clockwise or both counterclockwise as successive reversed direction currents flow through the storage structure.

The weakly coupled storage structure produces, during switching, substantial demagnetizing fields and stray magnetic fields external to the structure as the magnetizations in the ferromagnetic layers become nonparallel during rotation in that process due to the occurrence of additive parallel components of magnetizations. These external stray fields are nearly completely eliminated in the strongly antiparallel coupled storage structure as the demagnetization fields of the ferromagnetic layers being always maintained opposed in direction but otherwise parallel correspondingly always act to cancel one another.

This is an important advantage of the antiferromagnetically coupled structure in being relatively insensitive to externally applied magnetic fields. The torque on an antiferromagnetically coupled structure with ferromagnetic layers "sandwiching" a ruthenium layer due to an external field can be expressed in terms of the ferromagnetic layer thicknesses, $t_{Top}$ and $t_{Bot}$, and saturation magnetizations, $M_{sTop}$ and $M_{sBot}$. Ignoring terms due to internal effects such as edge curling and anisotropy, the torque per unit area for each layer is $$\text{Torque}(\theta_{Top}) = |\vec{H}_{ext}| t_{top} M_{sTop} (\sin(\theta_{ext} - \theta_{Top})) - B(\theta_{Top} - \theta_{Bot})$$

$$\text{Torque}(\theta_{Bot}) = |\vec{H}_{ext}| t_{Bot} M_{sBot} (\sin(\theta_{ext} - (\theta_{Bot} + \pi))) + B(\theta_{Bot} - \theta_{Top})$$

where $\vec{H}_{ext}$ = is an externally applied field $M_{sTop}$, $M_{sBot}$ = layer saturation magnetization (parallel to the magnetic moment of the layer)

$t_{Top}$ and $t_{Bot}$ are the top and bottom layer thicknesses

B = antiferromagnetic exchange constant for the Ru interlayer $\theta_{Top}$ = local angle of top layer magnetization $\theta_{Bot}$ = local angle of bottom layer magnetization So long as the antiparallel exchange coupling between the top and bottom layers is strong (B is large) compared to the magnetostatic energy due to the applied field, $\theta_{Bot} - \theta_{Top}$ will be very small, meaning the top and bottom magnetizations remain essentially antiparallel. The net torque on the antiferromagnetically coupled structure is then (setting $\theta_{Top} = \theta_{Bot} + \pi$)

$$\text{Net torque} = |\vec{H}_{ext}| t_{Top} M_{sTop} - |\vec{H}_{ext}| t_{Bot} M_{sBot}.$$

This net torque is clearly zero if $$t_{Top} M_{sTop} = t_{Bot} M_{sBot}.$$

The terms ($t_{Top} M_{sTop}$) and ($t_{Bot} M_{sBot}$) are designated as the effective magnetic moments of the top and bottom layers, respectively. So long as these values are within 10% of one another, the desired insensitivity to external magnetic fields follows.

No net torque from an externally applied field means that there is no cause for the magnetization of the sandwich to rotate. In contrast, if an external field is applied to a weakly coupled sandwich, the magnetization of each layer responds independently to that field since there is no restriction on the relative orientations between $\theta_{Bot}$ and $\theta_{Top}$. Hence, both layers rotate to make their magnetizations more parallel to $\vec{H}_{ext}$.

Just which of strongly antiparallel coupled storage structure 21 and the weakly coupled storage structure described above will require the smaller storage current in switching the directions of the magnetizations of the two ferromagnetic layers therein depends on a number of parameters. The actual applied magnetic fields acting on the ferromagnetic layers in storage structure 21 resulting from storage currents established therein are smaller per unit current than in the weakly coupled storage structure because the current portion through the very thin intermediate ruthenium layer is small, and such current portions are more effective in producing magnetic fields than the current portions through the ferromagnetic layers themselves. Also, with the thicker intermediate layer in the weakly coupled storage structure, there is no strong antiparallel coupling as indicated above, and an external current strap, often termed a "word line", can be used to create a tipping field, which acts to reduce the storage current needed for switching the direction of magnetizations of the ferromagnetic layers therein. On the other hand, absent such tipping fields, weakly coupled storage structures with thicker intermediate layers have significant demagnetizing fields opposing rotational fields, as indicated above, which act to make the current required to switch the direction of magnetizations of the ferromagnetic layers therein larger. Further, the nature of domain walls in the ferromagnetic layers for either strongly antiparallel coupled storage structure 21 or the weakly coupled storage structure could differ and could differently affect the magnitudes of storage currents required.

The difference in switching behavior between the two kinds of storage or bit structures when they have similar layer thicknesses and layer conductivities can be most easily seen by comparing the sense current switching thresholds when operating them using only sense currents to force switchings between alternative magnetic states. The central interior regions of the two ferromagnetic layers in the weakly coupled structure, at the threshold value of the sense current, have the magnetizations thereof at approximately right angles to each other as seen in FIG. 6G. The central interior regions of the two ferromagnetic layers in the antiferromagnetically coupled structure, however, has the magnetizations thereof antiparallel to each other as shown in FIG. 6H.

The top view of the of the weakly coupled structure seen in FIG. 7A for sense current therethrough at the switching threshold value shows that a significant magnetic free pole density has built up in the ferromagnetic layers end regions (illustrated by solid and dashed line arrows at the right end thereof) of the bit structure as a consequence of the magnetizations of top and bottom ferromagnetic layers being largely parallel in this region. The corresponding top view of the antiferromagnetically coupled structure seen in FIG. 7B for sense current therethrough at the switching threshold value shows that there is very little free pole buildup occurring in the ferromagnetic layers end regions (again illustrated by solid and dashed line arrows at the right end thereof) due to the antiparallel nature of magnetizations in these two layers. The relative absence of free poles and their corresponding demagnetizing fields in the antiferromagnetically coupled structure means that the effective sense current, or resulting sense magnetic field, switching threshold is much smaller in these circumstances.

Figure 10:
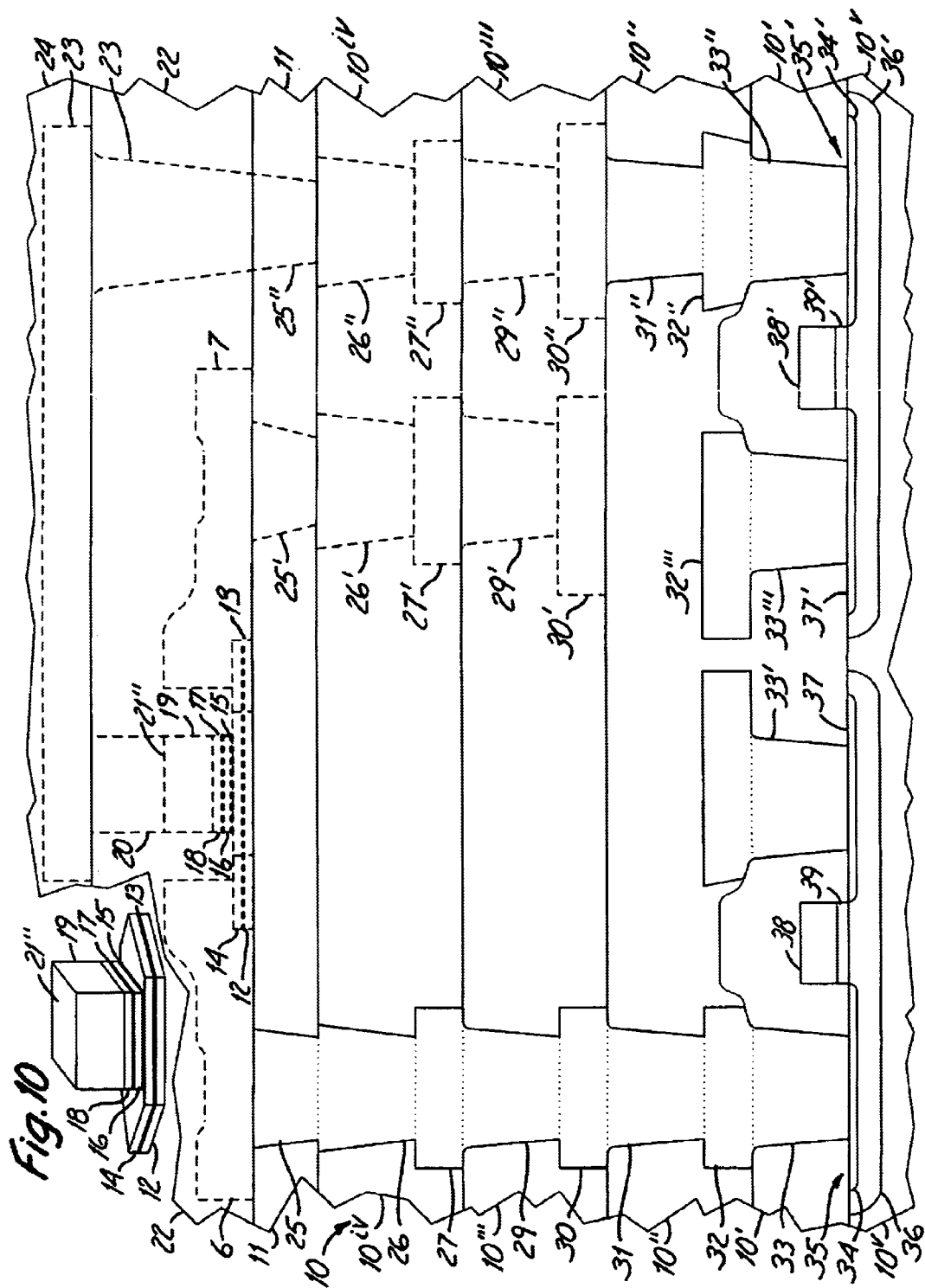
FIG. 10 represents a layer diagram of portions of a monolithic integrated circuit structure embodying the present invention.

A full memory cell with a retrieval structure appended to storage structure 21 that uses a magnetic tunneling, or barrier, junction to produce a large sense signal for high rate data access with a relatively small sense current is shown in the layer diagram of FIG. 10. The substantially reduced stray fields means that this memory cell can be used in a dense array. Here, too, a perspective view of just the memory cell structure is shown in the upper left hand corner of the figure, and the layer diagram gives an indication of the structural layers, but is not a true cross section view in that many dimensions there are exaggerated or reduced relative to one another for purposes of clarity.

Such a magnetoresistive memory cell device in its basic form has for its bottom three layers forming the storage structure again two strongly antiparallel coupled ferromagnetic thin-films (typically permalloy layers) with a nonmagnetic antiparallel coupling layer between them (typically a thin ruthenium layer) in a first "sandwich" construction. The two thin-film layer edges parallel to the major extent, or length, of the device, and the direction of storage current flow current flow, are perpendicular to the easy axes of those layers and would preferably be magnetically hard in order to avoid trapped domain walls after the cell has a series of magnetic states set therein to represent stored data as a result of arbitrary stored data sequences. In a further addition to this device, the upper ferromagnetic layer of these just described bottom three layers serves also as part of a pinned layer magnetic tunnel junction second "sandwich" structure (or spin dependent tunnel structure) through having a barrier layer thereon which in turn supports a cobalt iron (CoFe) ferromagnetic layer having its magnetization direction pinned by an antiferromagnetic layer in turn on it.

The cell has data, or a magnetic state, stored therein by passing a relatively high current through the lower three layer first sandwich structure, which provides a magnetic field in opposite directions in the two strongly antiparallel coupled ferromagnetic layers of that structure. The direction of the current is used to store either a magnetic state therein representing a binary "1" or an alternative magnetic state representing a binary "0". The two magnetic states are determined by either the upper one of the lower two ferromagnetic layers in the first sandwich structure being magnetized along the device width (and easy axis thereof) toward one of the device long sides with the bottom one of these two ferromagnetic layers being magnetized to the opposite side for one state, or vice versa for the alternative second magnetic state. Retrieving the stored data, i.e. determining which magnetic state the device is in, is accomplished by establishing a tunneling current through the barrier junction provided between the pinned cobalt iron layer in the second "sandwich" structure and the upper ferromagnetic layer in the first "sandwich" structure that is also in the second "sandwich" structure.

The pinned cobalt iron layer in the second "sandwich" structure is connected through the antiferromagnetic layer to a first transistor to at least in part control the tunneling current used for data retrieval, and a second transistor is connected to the storage structure in the first sandwich structure to control the storage current to form the basic memory cell in addition to controlling in part the tunneling current in some retrieval schemes. This device can be selected for having a storage current established therein in an array of cells with this second transistor being the selection transistor. Retrieving data stored in the device by determining its magnetic state requires that the resulting voltage occurring across the barrier junction following the establishment of a fixed tunneling current through the first transistor (both transistors in some schemes) be compared to a reference to determine the state of the magnetizations of the two ferromagnetic layers on either side of the nonmagnetic layer in the first "sandwich" structure. One desirable reference would be based on providing a threshold voltage half-way between a device output voltage representing a binary "0" and a device output voltage representing a binary "1" so that the difference between the output signal and the reference is either a plus or negative voltage, and so permit a simple comparator to be used to detect the memory cell magnetic state.

The tunneling barrier in FIG. 10 can be aluminum oxide. Although ruthenium of a suitable thickness to cause antiparallel coupling between the two ferromagnetic layers is typically used as the material for the nonmagnetic layer in the first "sandwich" structure, a better conductor like copper can be used instead again if chosen of a suitable thickness to result in antiparallel coupling between the two ferromagnetic layers. Better conductors for the nonmagnetic layer give stronger effective fields that are applied to the ferromagnetic layers in the first "sandwich" structure.

In addition, while a single pinned cobalt iron layer has been described, that arrangement would result in the stray fields of an "open flux" structure which could prevent operation at small device geometries needed to achieve a high areal density array. A pinned synthetic antiferromagnet formed of an antiferromagnetic layer provided on a three layer arrangement having two layers of cobalt iron separated by a layer of ruthenium instead of the single cobalt iron layer, in which the two cobalt iron layers are of approximately equal thicknesses and are strongly antiparallel-coupled would eliminate any such stray field problem.

The spin dependent tunneling-antiparallel coupled layers memory cell device, or integrated antiparallel coupled tunneling device memory cell, actually shown in FIG. 10 has the controlled current paths immediately connected thereto also shown. This memory cell structure is provided on a semiconductor material monolithic integrated circuit chip serving as a substrate therefor and having electronic circuit component devices provided in the semiconductor material thereof as the substrate for the remaining portions of the integrated circuit itself. Those remaining portions of the monolithic integrated circuit are a series of four electrical insulating layers, $10'$, $10''$, $10'''$, $10^{iv}$, each typically formed of silicon dioxide, provided on the indicated semiconductor material, $10^v$, to form substrate 10 supporting the memory cell structures. Each of the lower three of these electrical insulating layers have a metal circuit interconnection pattern supported thereon for electrically interconnecting selected ones of the circuit component devices therebelow in semiconductor material $10^v$ and the integrated "sandwiches" tunneling devices provided thereabove.

Following chemical and mechanical polishing of the surface of last or uppermost electrical insulating layer $10^{iv}$, and the opening of vias therein to provide metal interconnections to the interconnection layer therebelow, electrical insulating layer 11 is formed on the resulting surface by sputter deposition and silicon nitride to a thickness of typically 1000 Å. The surface of layer 11 is then also chemically and mechanically polished to provide a resulting surface on which the integrated "sandwich" tunneling device is to be provided.

This integrated "sandwich" tunneling device is next provided by a series of layer depositions with portions of these deposited layers being later removed by ion milling to leave the desired device portions remaining on the upper surface of layer 11. The remaining portions will be designated with the same numerical designation as are used in describing the deposition layers from which each is formed and shown in dashed line form in FIG. 10 because of being positioned rearward from the plane of the figure. Thus, first ferromagnetic thin-film layer 12 is deposited of an alloy comprising 65% nickel, 15% iron and 20% cobalt deposited to a thickness of 40 Å. This layer is deposited in an easy axis orienting magnetic field directed from front to back, or back to front, in FIG. 10 across the width of the finally formed devices to induce the easy axis in this layer to lie perpendicular to the plane of the figure.

Thereafter, electrically conductive, but nonmagnetic, thin-film storage structure intermediate layer 13 of ruthenium (Ru) is deposited to a thickness of 9 Å to form the antiparallel coupling layer represented as a dashed, bold solid line in FIG. 10. Ruthenium yields a smoother resulting exposed surface after its deposition, but copper of a suitable thickness for antiparallel coupling could alternatively be used.

This intermediate layer is followed by providing further ferromagnetic thin-film layer 14 again an alloy of 65% nickel, 15% iron and 20% cobalt deposited to a thickness of 40 Å. Layer 14 is again deposited in an easy axis orienting magnetic field to induce the easy axis in this layer to also lie perpendicular to the plane of the figure. Layers 12, 13 and 14 together form the basis for a "sandwich" structure, i.e. the storage structure described above having two strongly antiparallel coupled ferromagnetic thin-film layers therein, and layer 14 will also be directly part of the spin dependent tunneling device next to be next completed through providing the remainder thereof as described below.

Next, a spin dependent tunneling, or SDT, intermediate layer, or barrier layer, 15, is provided by sputter deposition onto layer 14, this barrier layer being a dielectric and represented as a dashed, bold solid line in FIG. 10. Layer 15 is provided typically by sputter depositing 12 Å of aluminum onto layer 14, and continuing to provide two further angstroms of this material using the aluminum sputtering target but also introducing oxygen into the sputtering chamber. The result is to convert the already deposited aluminum layer substantially into aluminum oxide which expands its thickness by a factor of about 1.3, and to add another two angstroms of aluminum oxide thereto giving a barrier layer thickness of approximately 17.5 Å with this layer being formed primarily of aluminum oxide.

The provision of barrier layer 15 is followed by providing a compound ferromagnetic thin-film and conductive thin-film layer combination together on layer 15 as a pinned synthetic antiferromagnet. This compound thin-film layer is provided to have a net layer magnetization that, when fixed in a selected spatial orientation in the finally formed structure, will resist magnetization rotation, and certainly resist firmly any magnetization rotation therein that could be sufficient to lead to a reversal in its orientation as a result of expected externally applied magnetic fields. Thus, for the finally formed cell structures intended to be used in limited magnetic fields, the magnetization of this compound thin-film layer will appear fixed in its orientation in the device, i.e. "pinned" in a direction relative to the finally formed cell structure which will again be perpendicular to the plane of FIG. 10.

This compound thin-layer film is formed by first sputter depositing a ferromagnetic thin-film layer, 16. Layer 16 is of cobalt iron comprising 95% cobalt and 5% iron to a thickness of 50 Å which layer is deposited in the presence of an easy axis direction determination magnetic field that is aligned with the easy axis direction of the ferromagnetic layers 12 and 14 therebelow. Then a nonmagnetic layer, 17, of ruthenium is sputter deposited to provide a Ru antiferromagnetic coupling layer of 9 Å thickness shown as a dark dashed line in FIG. 10. Thereafter, another ferromagnetic layer, 18, of cobalt iron comprising 95% cobalt and 5% iron is deposited to a thickness of 50 Å, and deposited again in the presence of an easy axis direction determination magnetic field aligned as was the field for layer 16. The resulting compound layer of layers 16, 17, 18 has materials with high spin polarization in its outer layers due to the use of high magnetic induction cobalt iron therein, but has little total magnetic moment because of the Ru layer provided therebetween which strongly antiferromagnetically couples these outer layer through primarily exchange coupling so that the magnetizations of each are pointed in opposite directions. Thus, this layer is relatively insensitive to externally applied magnetic fields and contributes little to the spatial magnetic fields thereabout. However, the magnetization direction in this composite layer by itself is not very strongly fixed in any direction because of the relatively weak anisotropy exhibited by the CoFe layers.

Thus, a further antiferromagnetic material "pinning" layer exhibiting a substantial magnetic anisotropy must be deposited on layer 18 to strongly set the magnetization direction of compound layer 16, 17, 18 in the direction of the easy axis in layers 12 and 14. Such a layer has a strongly fixed magnetization direction which, through exchange coupling to layer 18, strongly fixes the direction of magnetization of that layer also, and so that of layer 16 through Ru layer 17. The result is an antiferromagnetic layer coupled strongly to compound layer 16, 17, 18 which also provides a high magnetic inductance material layer, layer 16, with a corresponding substantial spin polarization against barrier layer 15. Hence, a CrPtMn pinning layer, 19, of 45% chromium, 10% platinum and 45% manganese is sputter deposited on layer 18 to a thickness of 300 Å in the presence of a magnetization axis determination magnetic field aligned with the field used in forming cobalt iron layers 16 and 18.

Upon completion of this antiferromagnetic magnetization pinning arrangement shown in FIG. 10 using these magnetization direction determination layers, a 1000 Å layer of aluminum is sputter deposited on pinning layer 19. The resulting layer, 20, after final formation thereof protects what is below, and allows electrical connections thereto for circuit purposes.

Next in this fabrication process, a further layer is deposited on layer 20 to provide an etching termination layer, or stop, for subsequent etching steps. A milling mask layer is then sputter deposited on the etch stop layer to there be prepared for use as a milling mask by being suitably patterned using standard techniques. This last masking pattern is to result, after milling therethrough to remove the exposed ferromagnetic, antiferromagnetic and nonmagnetic layers therebelow, in providing the pinned electrode structures in the memory cell spin dependent tunneling structures which are formed in a "sandwich" construction with barrier layer 15 and ferromagnetic thin-film layer 14. This subsequent ion milling step removes the exposed portions of aluminum layer 20, the next exposed portions of pinning layer 19, and then the next exposed portions of the compound layer 16, 17 and 18 down to barrier layer 15 to thereby form the structures of such pinned electrodes in each memory cell.

A second material removal step is then performed to form the barrier and storage structure for each memory cell. Following standard patterning arrangements, ion milling is used to form the storage structure devices for the memory cells with the corresponding barrier layer thereover in the form of central rectangular solids with a pair of triangular solids ends on either side thereof along the lengths (as was shown in FIG. 6B) with the result being shown in FIG. 10. Alternatively, layers 12, 13 and 14 can instead form a storage structure shaped as a rectangular solid (as was shown in FIG. 6A) having "squared off" ends. The pinned electrodes formed above are each positioned on and over just the corresponding central rectangular solid in each memory cell as shown in FIG. 10. A milling mask layer is deposited and patterned in such a way as to form a pattern for an etching mask which is to be formed following that pattern by leaving the desired masking portions of that layer. The unwanted portions of the masking layer are removed down to barrier layer 15 serving as an etch stop.

This last masking pattern is to result, after milling therethrough to remove the exposed barrier layer, ferromagnetic layers and storage structure intermediate layer, in providing a substantial number of storage structures to serve as portions of the corresponding memory cells with each such storage structure device being in a "sandwich" construction having ferromagnetic layers 12 and 14 on either side of antiparallel coupling intermediate layer 13, and with barrier layer 15 and the corresponding pinned electrode thereon. The remaining portions of the masking layer serve as the above mentioned milling mask for the subsequent ion milling step which removes the exposed portions of barrier layer 15, and thereafter, also the next exposed portions of ferromagnetic thin-film layer 14, and the then exposed portions of conductive storage structure intermediate layer 13, and finally the then exposed portions of ferromagnetic thin-film layer 12 down to insulating layer 11 to thereby form the structure of the storage structure device and complete the structure of the memory cell, 21", as shown in FIG. 10.

Following the completion of memory cell structures 21", openings are made using standard steps through silicon nitride layer 11 to reach appropriate metal interconnection risers extending through other insulating layers in the monolithic integrated circuit therebelow, and a 1000 Å layer of aluminum alloyed with 2% copper is sputter deposited on triangular ends of the storage structures portions of memory cell structures 21" having ferromagnetic layers 12 and 14 with nonmagnetic layer 13 therebetween, and on the exposed portions of layer 11 and the interconnection conductors in exposed in the openings therein. After the patterning of this layer using standard methods, the resulting electrical interconnections, 22 and 23, to a memory cell structure 21" provide for circuit interconnection of that memory cell structure.

Thereafter, a layer of silicon nitride is sputter deposited over those structures and the exposed portions of insulating layer 11 to a thickness of 1000 Å to form another insulating layer. Photoresist is provided over this insulating layer as an etching mask to provide via openings therethrough in a following etching step to form a completed insulating layer, 24, and then through silicon nitride layer 11 to reach appropriate metal interconnection risers extending through other insulating layers in the monolithic integrated circuit therebelow.

On insulating layer 24, so prepared, a further metal deposition is made again of aluminum alloyed with 2% copper to cover that layer and fill the via openings therein, and in silicon nitride layer 11. This metal layer is deposited to a thickness of 2000 Å typically and patterned in a standard manner to eliminate the unwanted metal layer portions. The structures that result from this elimination are shown in FIG. 10 as an extension of interconnection 20 for interconnecting the pinned layers in the tunnel junction structure portion of memory cell structure 21" to the electronic circuitry in the integrated circuit therebelow through mating with metal interconnection risers extending through insulating layers of that integrated circuit. A further protective electrical insulating layer, 24', of silicon nitride is deposited to cover and protect interconnection 20.

Interconnection 22 extending from memory cell 21" in FIG. 10 meets an electrical interconnection riser on the left in that figure by having a portion thereof, 25, extend through silicon nitride layer 11 to reach a plug, 26, of tungsten and be in electrical contact therewith at the upper end of that riser. Plug 26 in turn extends through integrated circuit insulating layer $10^{iv}$ to reach and be in electrical contact with a portion, 27, of the third metal layer of that integrated circuit formed of primarily aluminum.

Third metal layer interconnection portion 27 is in contact with a further tungsten plug, 29, extending through electrical insulating layer 10''' to reach a portion, 30, of the aluminum second metal layer in the integrated circuit. Second metal layer portion 30 is in contact with a further tungsten plug, 31, which extends through electrical insulating layer 10" of the integrated circuit to a portion, 32, of the aluminum first metal layer of the integrated circuit.

First metal layer portion 32 is in contact with a final tungsten plug, 33, extending through electrical insulating layer 10' of the integrated circuit to reach semiconductor material $10^v$ of that integrated circuit, specifically, to be electrically connected to one of the terminating regions, 34, of a metal-oxide-semiconductor field-effect transistor (MOSFET), 35. Terminating region 34 of transistor 35 is formed of an $n^+$-type conductivity material formed in a p-type conductivity material tub, 36, in n-type conductivity semiconductor material $10^v$. Transistor 35 has a further $n^+$-type conductivity material terminating region, 37, formed in p-type conductivity material tub 36. In addition, transistor 35 has an $n^+$-type conductivity polysilicon gate, 38, between terminating regions 34 and 37 separated from tub 36 by a thin gate oxide, 39.

Terminating region 37 has a tungsten plug, 33', extending through electrical insulating layer 10' of the integrated circuit to reach another portion, 32', of the first metal layer of the integrated circuit. In a typical arrangement, first metal layer portion 32' extends to other switching transistors as in a memory cell switch based selection scheme which in turn are connected between pads suited for connection to positive and negative sources of voltage, or between a positive source of voltage and a ground reference voltage as shown there, that permit selecting the current flow direction through this transistor and the memory cell structure 21" connected thereto. In this situation, terminating region 37 serves alternatively as a drain and a source for transistor 35. In either situation, memory cell structure 21" will have current provided therethrough controlled by transistor 35, and by other switching transistors not shown in this figure.

Interconnection 23 extending from memory cell 21" in FIG. 10 is positioned on an electrical interconnection riser just to the right of center in FIG. 10 by being in electrical contact with a first plug, 25', of aluminum at the upper end of that riser. Plug 25' extends through silicon nitride layer 11 to reach a second plug, 26', of tungsten which in turn extends through integrated circuit insulating layer $10^{iv}$ to reach and be in electrical contact with another portion, 27', of the aluminum third metal layer of that integrated circuit.

Third metal layer interconnection portion 27' in FIG. 10 is in contact with a further tungsten plug, 29', extending through electrical insulating layer 10''' to reach another portion, 30', of the aluminum second metal layer in the integrated circuit. Second metal layer portion 30' extends to a ground reference voltage, or to other switching transistors as in a memory cell switch based selection scheme which in turn are connected between pads suited for connection to a positive source of voltage and to a ground reference voltage.

Interconnection 20 extending from memory cell 21'' on the right in FIG. 10, and through insulating layer 22, meets an electrical interconnection riser on the right in that figure by having a portion thereof, 25'', extend through silicon nitride layer 11 to reach a plug, 26'', of tungsten and be in electrical contact therewith at the upper end of that riser. Plug 26'' in turn extends through integrated circuit insulating layer $10_{iv}$ to reach and be in electrical contact with a portion, 27'', of the aluminum third metal layer of that integrated circuit.

Third metal layer interconnection portion 27'' is in contact with a further tungsten plug, 29'', extending through electrical insulating layer 10''' to reach a portion, 30'', of the aluminum second metal layer in the integrated circuit. Second metal layer portion 30'' is in contact with a further tungsten plug, 31'', which extends through electrical insulating layer 10'' of the integrated circuit to another portion, 32'', of the aluminum first metal layer of the integrated circuit.

First metal layer portion 32'' is in contact with a final tungsten plug, 33'', extending through electrical insulating layer 10' of the integrated circuit to reach semiconductor material $10^v$ of that integrated circuit, specifically, to be electrically connected to one of the terminating regions, 34', of another MOSFET, 35'. Terminating region 34' of transistor 35' is formed of an $n^+$-type conductivity material formed in a p-type conductivity material tub, 36', in n-type conductivity semiconductor material $10^v$. Transistor 35' has a further $n^+$-type conductivity material terminating region, 37', formed in p-type conductivity material tub 36'. In addition, transistor 35' has an $n^+$-type conductivity polysilicon gate, 38', between terminating regions 34' and 37' separated from tub 36' by a thin gate oxide, 39'.

Terminating region 37' has a tungsten plug, 33''', extending through electrical insulating layer 10' of the integrated circuit to reach another portion, 32''', of the first metal layer of the integrated circuit. In a typical arrangement, first metal layer portion 32''' extends to a pad suited for connection to other switching transistors not shown used in a data retrieval selection scheme. In this situation, terminating region 37' may serve as either a drain or a source for transistor 35'.

Figure 11:
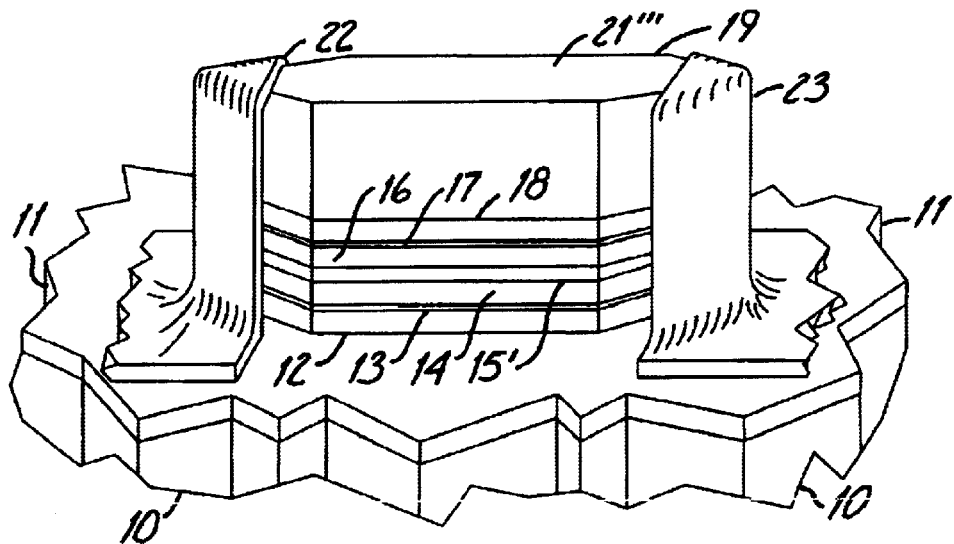
FIGS. 11 and 12 show perspective views of alternative structures embodying the present invention.

A full memory cell, 21''', with an alternative retrieval structure appended to storage structure 21 of FIGS. 6A or 6B that uses a relatively thick, weakly coupling electrically conductive layer in place of magnetic tunneling, or barrier, junction 15 to produce a large sense signal for high rate data access with a relatively small sense current is shown in the perspective diagram of FIG. 11. The resulting memory cell is a "spin-valve" magnetoresistive memory cell in which the storage structure with its strongly coupled antiparallel ferromagnetic layers serves as the "free" layer which can have its magnetization changed to be either parallel or antiparallel to the firmly fixed magnetization direction of the nearest ferromagnetic layer across the conductive layer in a pinning arrangement to thereby select one of the possible the cell magnetization states.

The electrically conductive layer, 15', in FIG. 11 replacing barrier layer 15 of FIG. 10 is typically of copper around 25 $\mu$m thick. The switching of the directions of magnetizations of strongly antiparallel coupled ferromagnetic layers 12 and 14 in the storage structure will place the magnetization of layer 14 either parallel to, or antiparallel to, the firmly fixed direction of magnetization of pinned ferromagnetic layer 16 in the pinned compound layer of layers 16, 17, 18 set by antiferromagnetic material "pinning" layer 19. However, the shunting effect of conductive layer 15' will lead to requiring a higher storage current for such magnetization direction switching unless a lower conductivity material is used for layer 15' while still providing a substantial "giant magnetoresistive effect". A sense current for data retrieval primarily flowing in conductive layer 15' will encounter either a higher or lower electrical resistance because of the "giant magnetoresistive effect" for the alternative magnetization states of the cell resulting in a higher or lower measured voltage drop across the memory cell to indicate the magnetic state of that cell.

The amount of current needed to store data in memory cells, i.e. set the cell magnetic state, does not necessarily decrease with decreasing dimensions of such cells. In fact, many kinds of very small magnetic memory cells require as much or even more current as the cell size decreases because of the corresponding increases in the demagnetization field that occur in such cells. However, the strong interatomic forces aligning electron spins (parallel for ferromagnetism and antiparallel for antiferromagnetism) diminish with increasing temperature and are overcome completely by thermal agitation at the Curie temperature ($T_C$) for ferromagnetic materials and at the Neel temperature ($T_N$) for antiferromagnetic materials.

As indicated above, the value of $H_{weff}$ in these small magnetic cells is typically less than 100 Oe. The energy well depth for a small magnetic memory cell can be greatly increased, as noted above, if an antiferromagnetic material is coupled to ferromagnetic material therein. Thus, a desirable magnetic memory cell can be formed by combining an antiferromagnetic pinning layer provided to increase the energy well depth of the resulting magnetic memory cell with a reduced Curie point ferromagnetic layer provided to reduce the storage magnetic fields (and thus the corresponding storage currents) needed to store data in such a cell.

At temperatures above the Curie point of a ferromagnetic material, the associated demagnetizing fields and crystalline anisotropy fields are essentially zero. Thus, as the temperature of the ferromagnetic material decreases through the corresponding Curie point, very little magnetic field need be present to effectively guide the ferromagnetic material magnetization into a desired state. As the temperature decreases further, the antiferromagnetic pinning material can be used to create a deep energy well provided that the Neel temperature thereof is below the Curie point of the ferromagnetic material. Crystalline anisotropy, field induced anisotropy, and shape anisotropy can also be used to assist in deepening the cell energy well. Because the magnetization of the ferromagnetic material increases rapidly with decreasing temperature below the material Curie point, even a few degrees to 50 degrees difference between $T_C$ and $T_N$ of the respective materials is sufficient to get both a deep energy well and much lower effective storage currents. Furthermore, the memory cell structures can be formed so that the thermal pulses provided by the storage currents have effective thermal time constants of less than 3.0 ns for submicron cells including jointly both the propagation time constant and the subsequent dissipation time constant.

Figure 12:
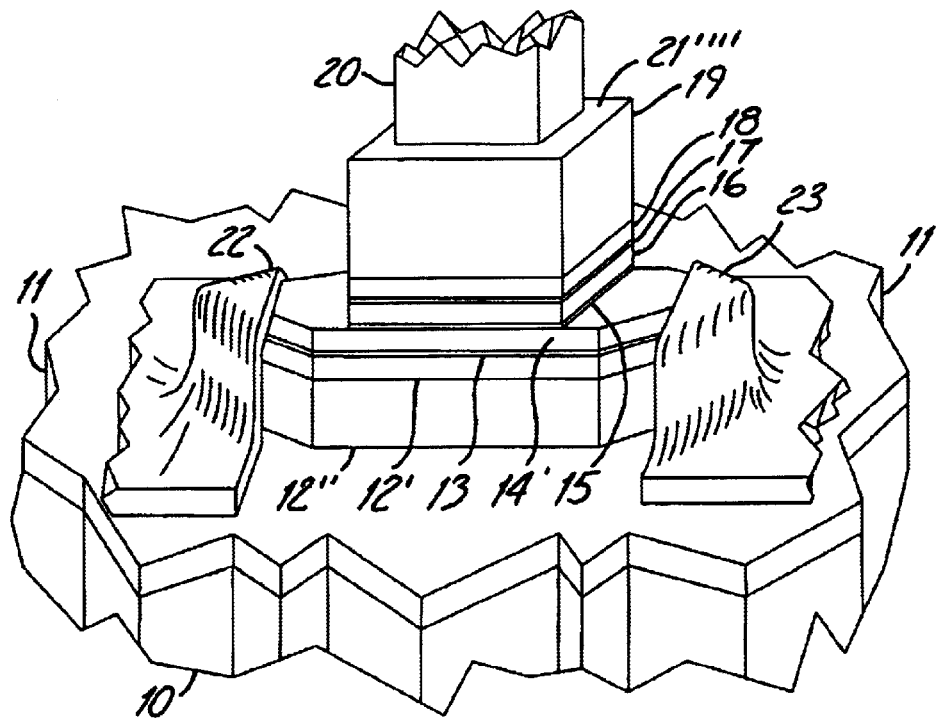

An implementation of such a thermally activated storage memory cell based on the integrated antiparallel coupled tunneling device memory cell shown in FIG. 10 is shown in FIG. 12 in which the layers that are in the same position as they were in FIG. 10 have the same numerical designations, but with a prime mark added thereto if new material properties are required, except for a newly added low Néel point temperature antiferromagnetic layer, 12'', as a pinning layer on insulator 11 supporting the remainder of the thermally activated storage memory cell, 21''''. Thus, low Néel point temperature antiferromagnetic pinning layer 12'' has a storage structure provided thereon beginning with a low Curie point temperature ferromagnetic layer, 12', followed by antiparallel coupling layer 13 on which is provided a low Curie point temperature ferromagnetic layer, 14'. This storage structure has barrier layer 15 provided thereon upon which in turn is provided a synthetic antiferromagnet structure.

This synthetic antiferromagnet structure has a compound layer formed on barrier layer 15 beginning a high Curie point temperature ferromagnetic layer, 16', followed by antiparallel coupling layer 17 on which is provided a high Curie point temperature ferromagnetic layer, 18'. On this compound layer is provided a high Néel point temperature antiferromagnetic layer, 19', as a further pinning layer to strongly set the magnetization direction of compound layer 16', 17, 18' in the direction of the easy axis in layers 12' and 14'.

The storage structure can have data stored therein, i.e. set to a selected magnetic state, with a storage current that causes the structure to heat above the Curie point temperature of low Curie point temperature ferromagnetic layers 12' and 14' in that structure. The low Curie point temperature ferromagnetic materials in these layers can be provided by adding a small amount of chromium to a nickel iron alloy, on the order of 5%, to get the Curie point temperature of the material to about 250° C. The Néel point temperature of low Néel point temperature antiferromagnetic pinning layer 12'' in the storage structure can be either higher than, or lower than, the Curie point temperature of ferromagnetic layers 12' and 14', but for this example choose it to be lower at 200° C. Thin ruthenium layer 13 keeps the magnetizations of ferromagnetic layers 12' and 14' antiparallel with one another to thereby have an effective antiferromagnetic coupling field of several thousands of Oe.

Thus, this storage structure is effectively a synthetic antiferromagnet which can have its magnetization direction reversed with a relatively low current through the device after being heated by a storage current to temperatures above the Curie point of ferromagnetic layers 12' and 14'. There, the demagnetizing fields and crystalline anisotropy fields associated with these layers are essentially zero, and, upon ending the storage current, the temperature of the ferromagnetic material in these layers decreases through its corresponding Curie point, very little magnetic field need be present to effectively guide the ferromagnetic material magnetization into a desired state. As the temperature falls further through the low Néel point temperature of antiferromagnetic pinning layer 12'', a deep energy well is created which will allow the memory cell to be very small without suffering data destroying thermal upsets. Tunneling currents through the high temperature synthetic antiferromagnetic structure and barrier layer 15 on which it is supported can be used as in memory cell 21' of FIG. 10 to determine memory state of this thermally activated storage memory cell 21''''.

There can be a substantial advantage in very small dimension memory cells in having the Néel point temperature of antiferromagnetic pinning layer 12'' temperature of the antiferromagnet chosen to be above the Curie point temperature of ferromagnetic layers 12' and 14' in the storage structure. This circumstance would allow these ferromagnetic layers to have data stored therein, that is, have a cell magnetic state selected, by storage currents heating the ferromagnetic layers past the Curie point temperature so that the magnetization is small, but could give the ferromagnetic layers a built-in deep energy well as the magnetization established by this current is locked-in as the current decreases leading the ferromagnetic layers temperatures falling back below the layer Curie points. The converse situation described in the above example where the Néel point temperature of antiferromagnetic pinning layer 12'' is lower than the Curie temperature of ferromagnetic layers 12' and 14' allows the magnetizations of those ferromagnetic layers established by the storage current after the Curie point has been reached to be unstable during cooling below the Curie point in the temperature range before the Néel point temperature is attained. In the case of a very narrow storage structure it may be difficult to get sufficient field-induced anisotropy to make the magnetization stable across the structure width without the pinning provided by antiferromagnet pinning layer 12''. Thus, in these circumstances the coupling between pinning layer 12'' and ferromagnetic layers 12' must be present as the Curie point of the ferromagnetic layers is reached during the cooling thereof following the ending of the storage current.

Figure 13:
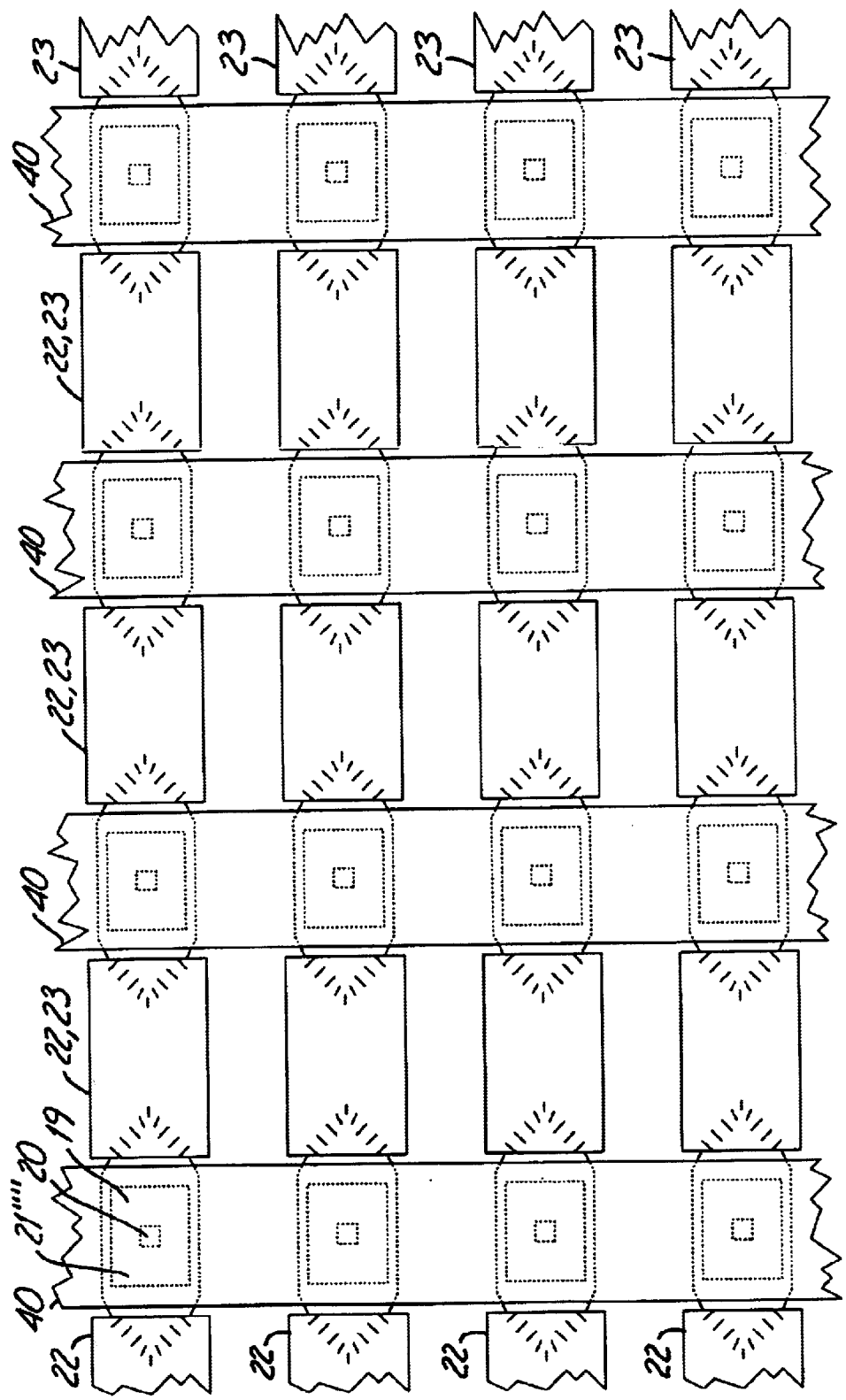
FIG. 13 is a top view of portions of a monolithic integrated circuit structure embodying the structure of FIG. 12 therein.

A selection arrangement for selecting a thermally activated storage memory cell in an array of such memory cells from all of the other cells to store data therein (set the cell magnetic state) is shown in the integrated circuit portion top view-schematic diagram combination of FIG. 13. The upper protective layers for the memory cell structures and interconnections below are omitted in this view for clarity. Again, many dimensions there are exaggerated or reduced relative to one another for purposes of clarity.

Each row of the array has the storage structure portions of memory cells 21'''' in that row electrically interconnected in series with one another through having interconnection 23 in a cell merge with interconnection 22 of the adjacent cell along that row. Memory cells 21'''' in each row are directly across from corresponding memory cells 21'''' in each adjacent row so that all such corresponding cells in each row are positioned under a common heating element, 40, (they could alternatively be over such a heating element) each of which elements thus extends orthogonally to the rows of series connected memory cells. Heating elements 40 are capable of having an electrical current established therein in current pulse form that is sufficient to suitably elevate the temperatures of the adjacent memory cells through resistive heating.

Thus, if the total heat generated from the combination of the resistive heating due to a storage current through a selected row of cells, and the heat propagated from the particular heating element 40 adjacent to a selected cell in that row, raises the temperature of the storage structure ferromagnetic layers 12' and 14' in this selected cell above the Curie point thereof, or raises the temperature of pinning antiferromagnetic layer 12'' above its Néel point, then the magnetic state of that cell can be set with the very small magnetic field generated by the decreasing current in the current pulse supplied to that heating element as this current pulse providing selective heating is ended. The heat generated by electrical current in heating elements 40 alone, and heat generated by storage currents in memory cell storage structures alone must be insufficient by themselves to raise the temperature of all memory cells 21"" in the array above the Curie point temperatures of the ferromagnetic layers materials used therein or the Néel points temperatures of the antiferromagnetic layers materials used therein. Note that none of the data retrieval circuitry or interconnections are shown except for a portion of layer 20 on antiferromagnetic layer 19 of each of memory cells 21"".

An alternative kind of electrical current in which the electrons therein have their spins organized in a direction to have a net spin polarization rather being randomly distributed in direction (between spin-up and spin-down), i.e. a spin current, can switch the magnetization direction of a ferromagnetic layer in a magnetic memory cell having approximately 400 Oe of shape anisotropy plus crystalline anisotropy in which the current density reaches $10^7$ A/cm$^2$ and exhibits a sufficient net spin polarization. This is accomplished by passing the electrons in such a current first through a highly polarizing material (cobalt) to generate the spin current, then through a thin layer (probably epitaxial) layer of copper or a tunneling barrier junction which are used in retrieving the store information (the magnetic tunnel junction to have around 1 Ohm-micron$^2$ ($\Omega$-$\mu m^2$) resistance are product with a magnetoresistance change of 40%), and finally into a ferromagnetic thinner layer of cobalt which is to have its magnetization direction switched. Another ferromagnetic layer strongly antiparallel coupled through a ruthenium layer to this last ferromagnetic layer will then also have its direction of magnetization switched as long as the ruthenium layer scatters the spin current to thereby randomize the spin directions of the electrons therein so that the current passing through the second ferromagnetic layer is not a spin current.

Such magnetization direction switching occurs through transfer of angular momentum (the angular momentum of an electron is a function of its spin property). When an electron interacts with a material in such a way as to flip the direction of spin of that electron, the angular momentum of the electron is transferred to that material. This transfer of angular momentum, in the atomic scale view, exerts magnetic torque on the magnetic moment in the material where the interaction occurred, and if sufficient, the magnetization direction of the magnetic material can be caused to rotate.

Thus, a vertical cell having a tunnel junction and a thin copper interconnection layer in series with an inner contact structure therebetween consisting of two ferromagnetic layers (10–50 Å thick) sandwiching a ruthenium layer of approximately 7–12 Å thickness forms a strongly antiparallel coupled device. Two outside electrodes are pinned synthetic antiferromagnets with the pinning antiferromagnetic materials on the side thereof away from the tunnel junction and the copper interconnection layer. These outside electrodes are permanently magnetized so that the magnetizations of the magnetic layers next to the junction and the interconnection layer are both oriented in the same direction.

Figure 14:
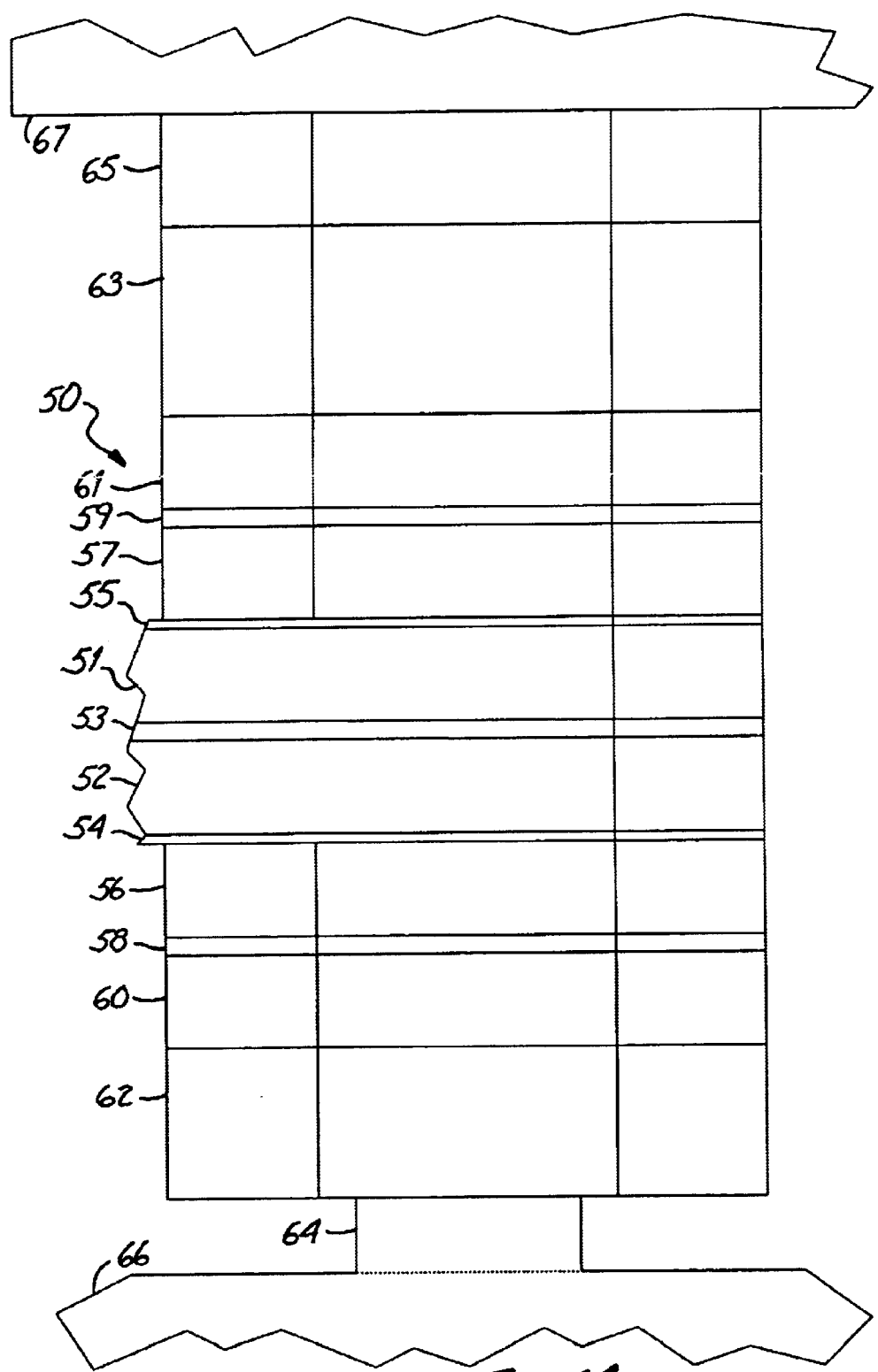
FIG. 14 represents a layer diagram of portions of a monolithic integrated circuit structure embodying another structure.
Figure 1B:
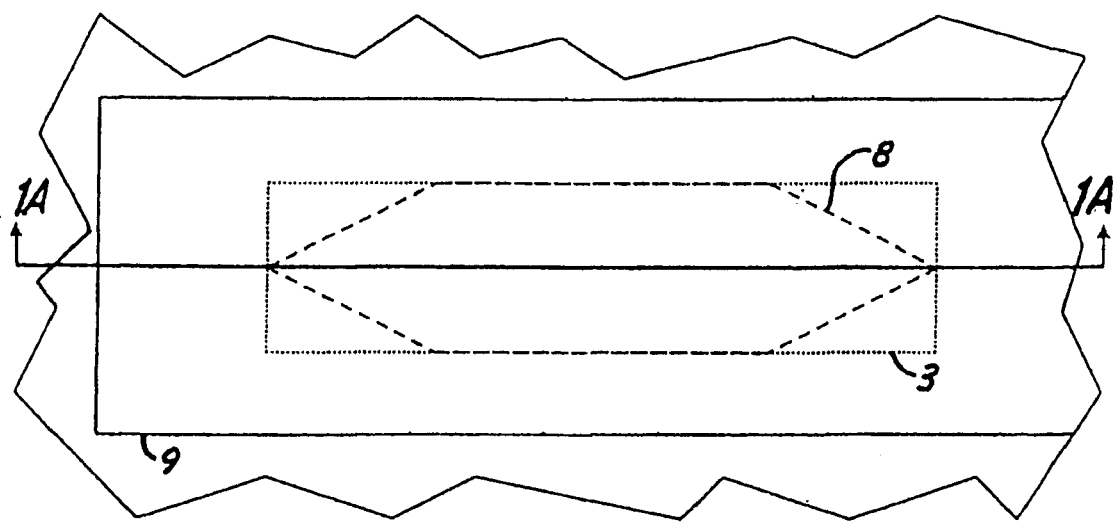
Figure 1A:
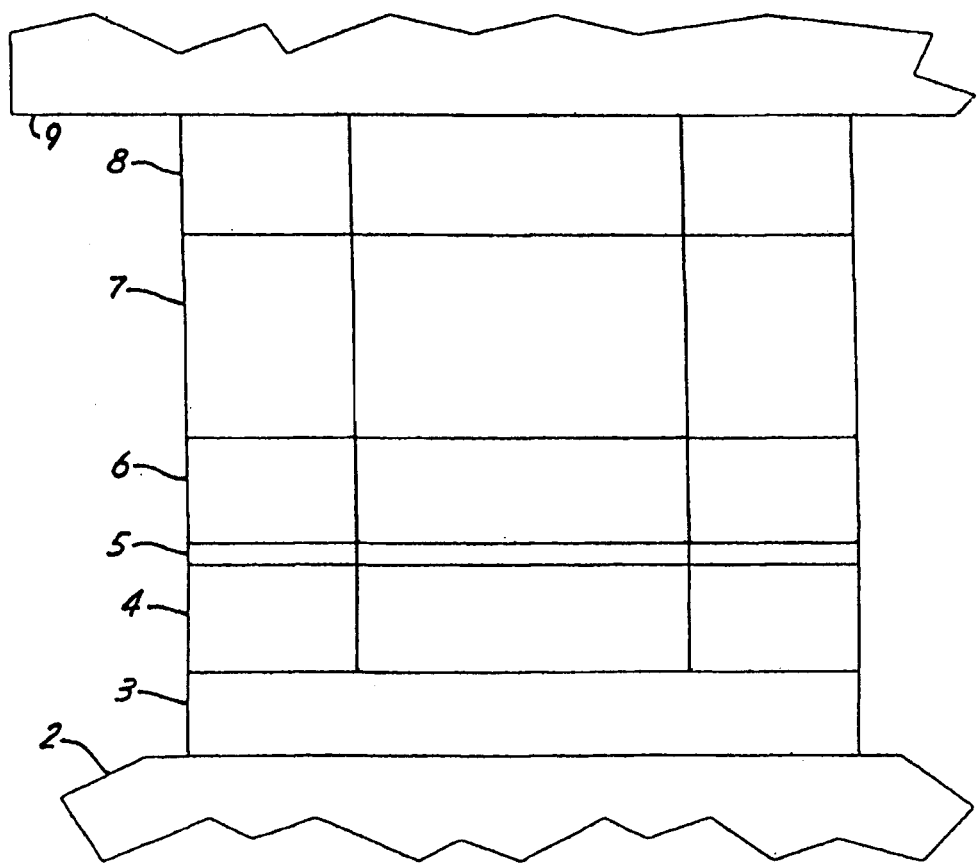
Figure 2A:
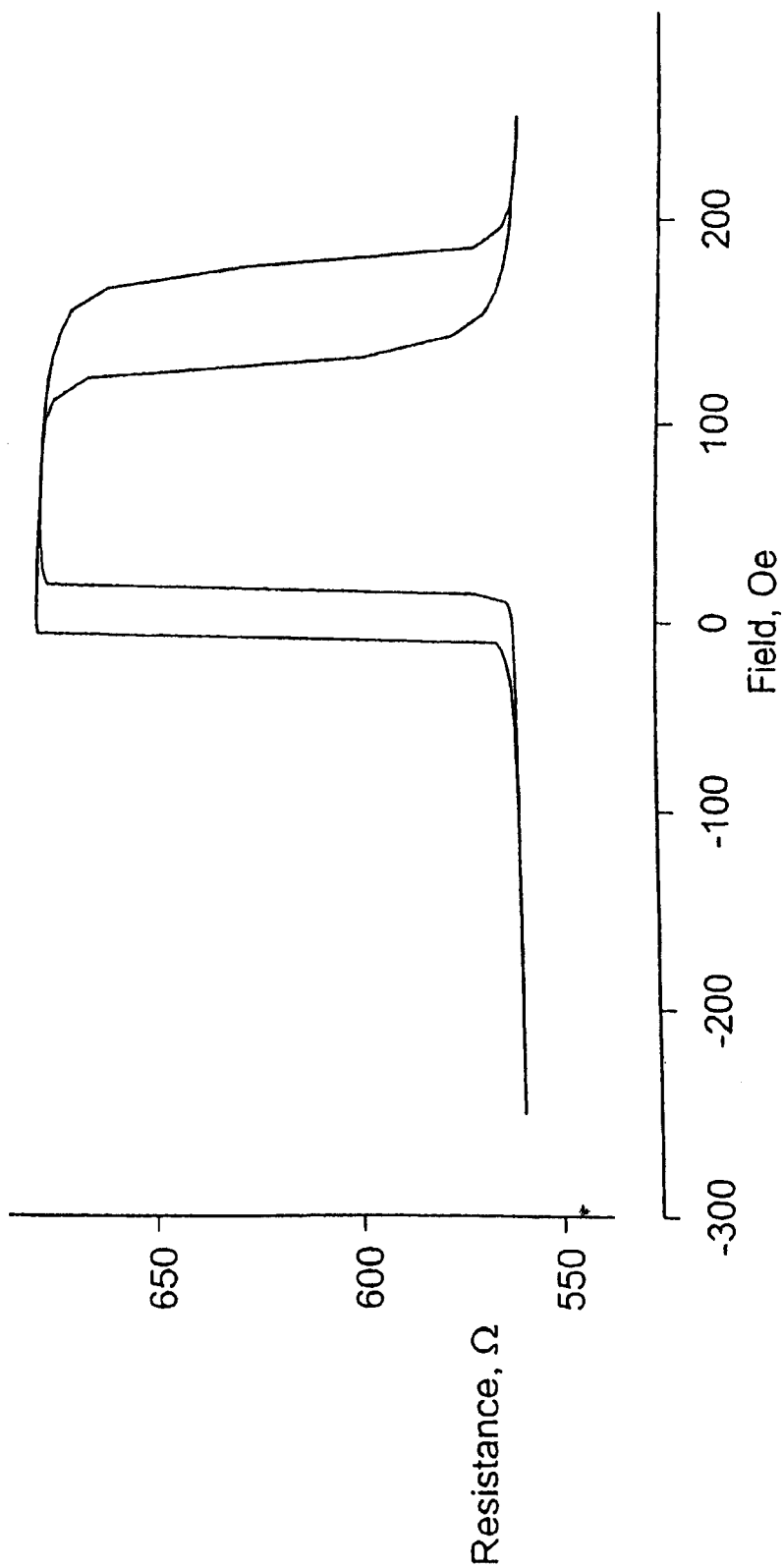
Figure 2B:
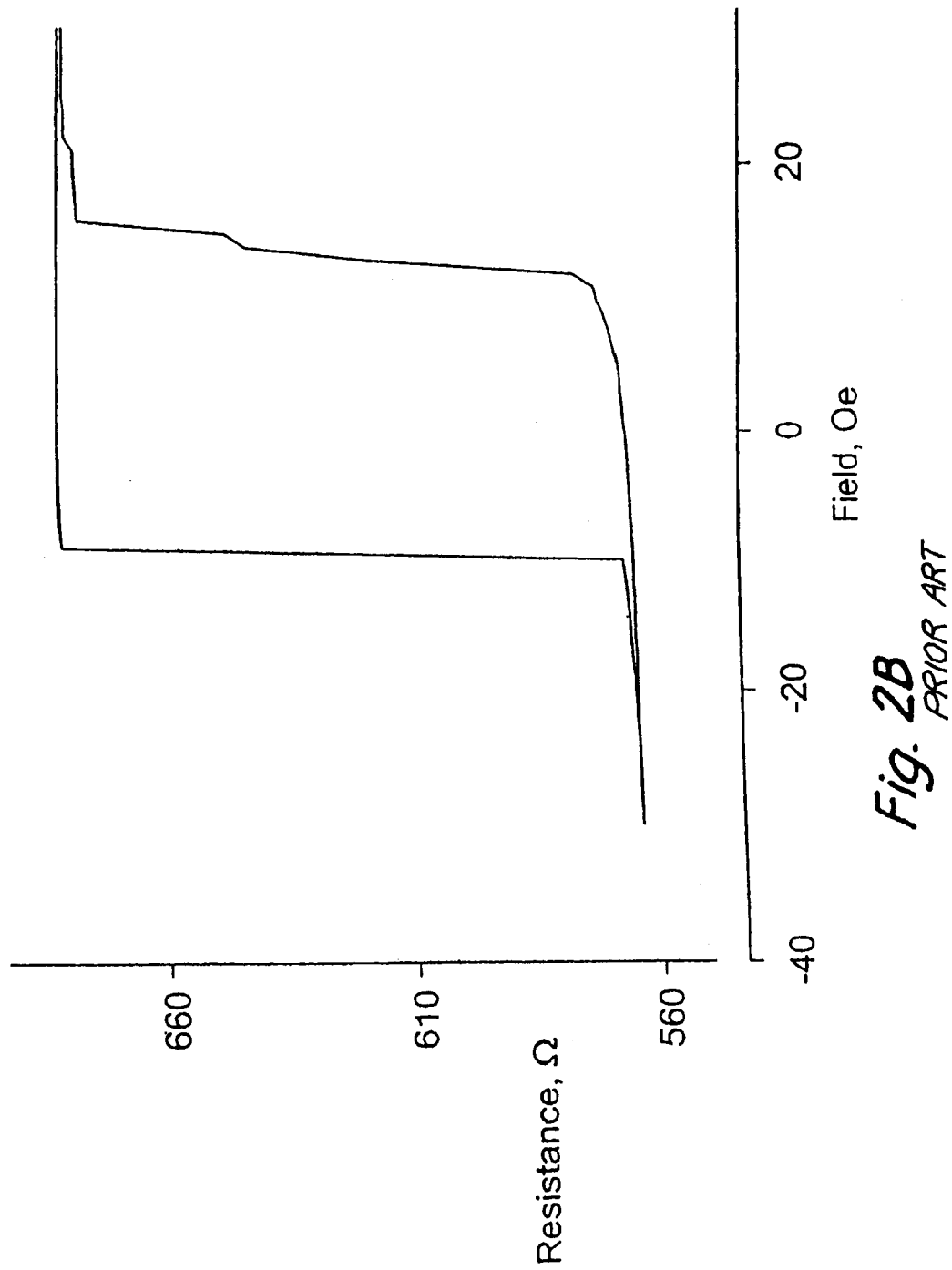
Figure 3:
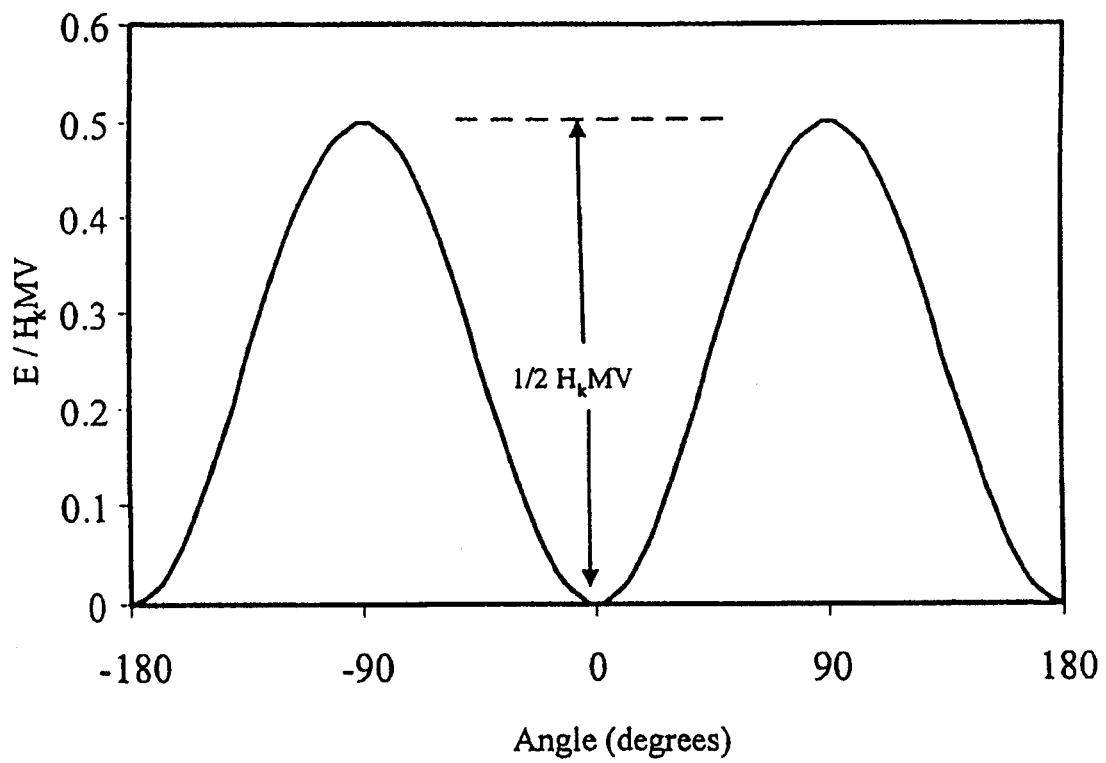
Figure 4:
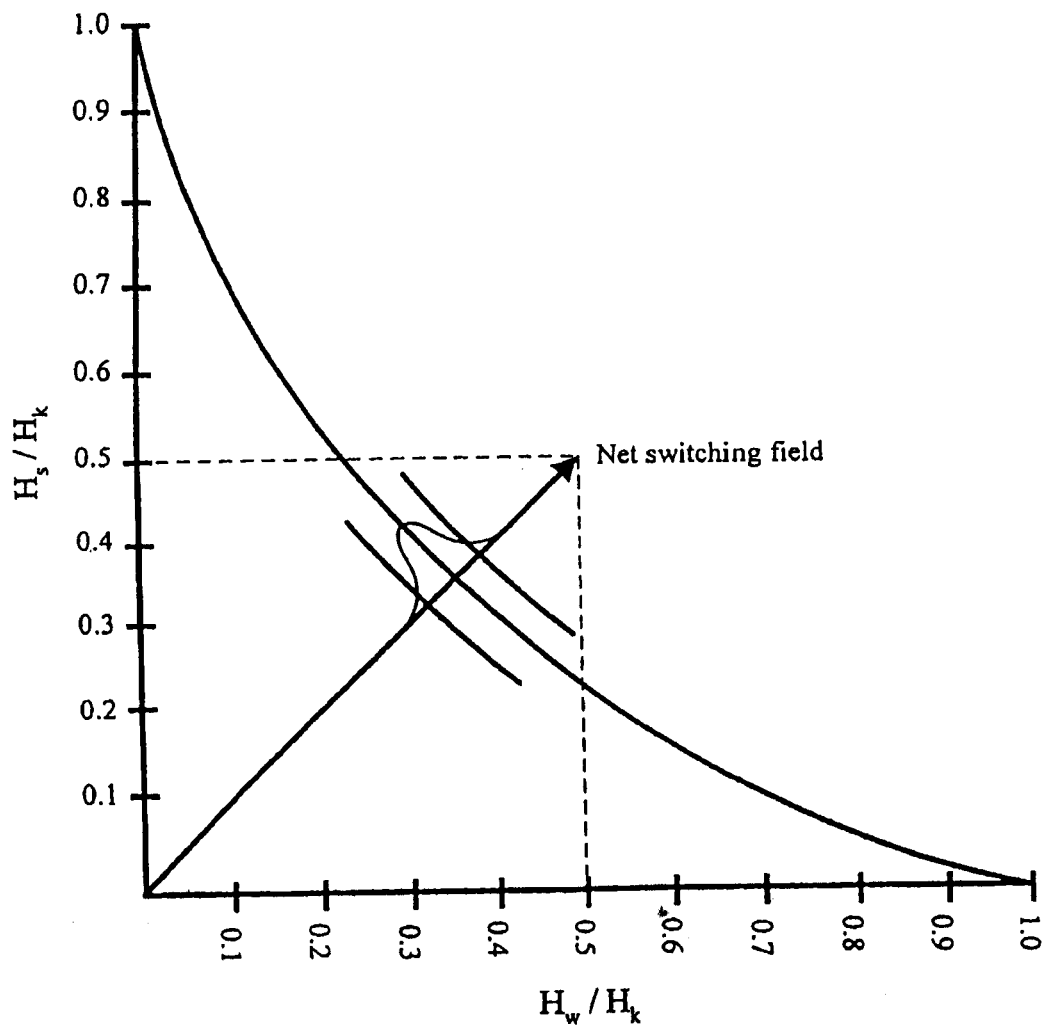
Figure 5A:
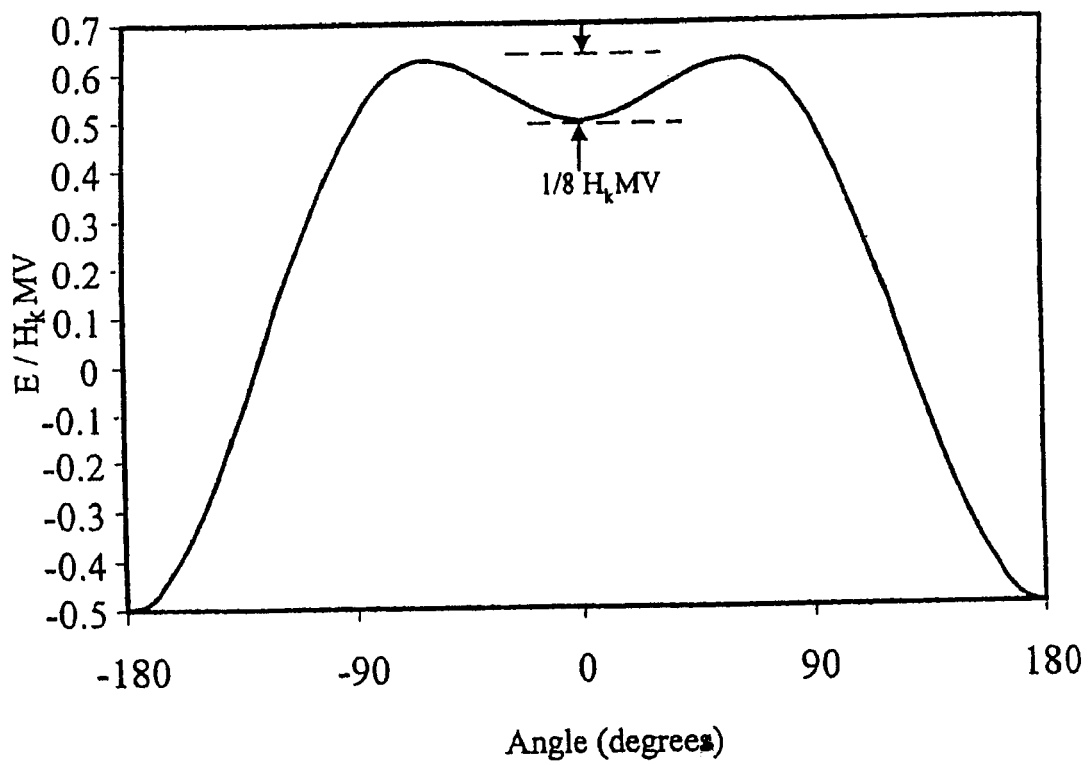
Figure 5B:
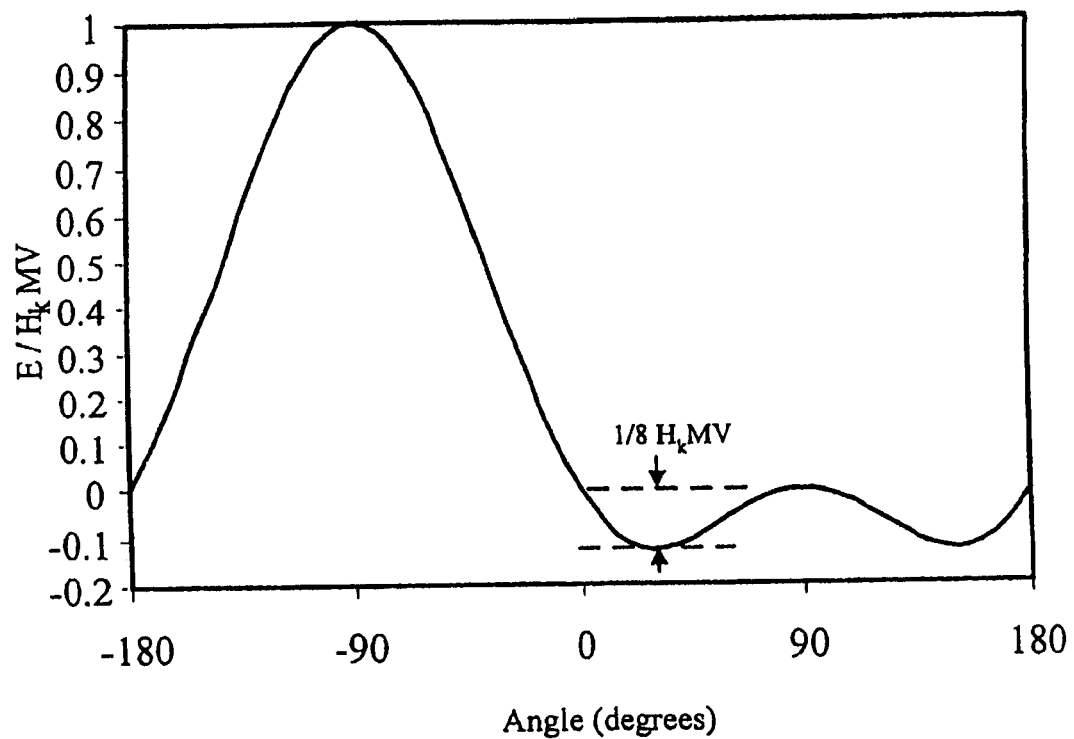

Such a vertically stacked memory cell structure, 50, is representatively shown in the side view of FIG. 14 though with many structural portions reduced or exaggerated for purposes of clarity. A pair of 50 Å thick ferromagnetic layers, 51 and 52, have a 9 Å thick ruthenium layer, 53, provided therebetween to form the inner contact structure and data bit storage layers. On the other side of ferromagnetic layer 52 directly supporting that layer is a 10 Å thick copper interconnection layer, 14, and directly on the other side of ferromagnetic layer 51 is a 4 Å thick aluminum oxide barrier layer, 55. Another 50 Å thick ferromagnetic layer, 56, directly supporting interconnection layer 54 completes a nonscattering spin current transfer path with interconnection layer 54 between ferromagnetic layers 52 and 56. A similar 50 Å thick ferromagnetic layer, 57, directly on barrier layer 55 completes a magnetic tunnel junction with barrier layer 55 between ferromagnetic layers 51 and 57 which also provides a nonscattering spin current transfer path.

A 9 Å thick ruthenium layer, 58, is provided directly supporting ferromagnetic layer 56, and another 9 Å thick ruthenium layer, 59, is provided directly on ferromagnetic layer 57. A ferromagnetic layer, 60, is provided directly supporting ruthenium layer 58, and a further ferromagnetic layer, 61, is provided directly on ruthenium layer 59. A chrome platinum manganese antiferromagnetic layer, 62, directly supports ferromagnetic layer 60 to form a pinned synthetic antiferromagnet to pin the magnetization direction of ferromagnetic layer 56 in a selected direction. Similarly, a chrome platinum antiferromagnetic layer, 63, is directly on ferromagnetic layer 61 to form a pinned synthetic antiferromagnet to pin the magnetization direction of ferromagnetic layer 57 in the same direction as that of ferromagnetic layer 56 along the length of the cell.

A tungsten plug, 64, extending through an electrical insulating layer directly supports and electrically contacts antiferromagnetic layer 62, and an aluminum cap, 65, is directly supported on chrome platinum antiferromagnetic layer 63. A lower electrical interconnection, 66, is in electrical contact with plug 64, and a further electrical interconnection, 67, is in electrical contact with cap 25.

Retrieving stored information is accomplished by injecting a smaller current (less in magnitude than needed for ferromagnetic layer magnetization switching) into outside contact 67, and taking that current out through the center electrode with copper interconnection layer 54. Observing the voltage difference between the outside electrode 67 with respect to the inner electrode, which is essentially the voltage drops across the barrier junction, will provide the output signal to indicate the storage state as the barrier junction will be in either its higher or lower magnetoresistance magnetic state. A "one" magnetic state and a "zero" magnetic state will provide corresponding output signals which are of different magnitudes.

An alternative use for the structures shown in FIGS. 6A and 6B is to use them as spin current injectors in semiconductor devices rather than as storage structures in memory cells. As spin current injectors, the layers 12, 13 and 14 as an injection structure will be supported on a semiconductor layer rather than insulator 11, either being supported directly on such a semiconductor layer, i.e. a semiconductor layer or layers substituted for insulator layer 11, or indirectly by having an intermediated layer between the semiconductor layer or layers and layers 12, 13 and 14 such as a very thin tunneling insulator layer. Spin currents, or spin polarized currents (in which electrons of one spin direction outnumber the electrons with spin in the opposite direction as indicated above) may be injected into a semiconductor material by placing ferromagnetic layer 12 in the structure of layers 12, 13 and 14 in close proximity to the silicon, gallium arsenide, or other semiconductor material provided to receive such injections, and passing a spin polarized flow of electrons through layers 14, 13 and 12 to exit ferromagnetic magnetic layer 12 into the semiconductor material. The means of conduction from layer 12 may be through a Schottky barrier, through a tunnel barrier, or directly through a diffuse contact thereof with the semiconductor material. The ferromagnetic material comprising 12 must be that of a spin polarizer such that there is a surplus of electron spins in one direction as opposed to the other at the Fermi level (or at a higher potential for ballistic, or higher voltage, transport) which supplies the electron flow from the magnetic material into the semiconductor forming the spin current.

Selectively establishing currents and their directions in the injection structures between electrical interconnections 22 and 23 for corresponding selective switching of the magnetization directions of strongly antiparallel coupled ferromagnetic layers 12 and 14 allows the spin polarization of the injected spin currents to be reversed by reversing the magnetizations in layers 12 and 14. This switching is accomplished without generating stray magnetic fields as described above for even very small injection structures having submicron dimensions.

Although the present invention has been described with reference to preferred embodiments, workers skilled in the art will recognize that changes may be made in form and detail without departing from the spirit and scope of the invention.

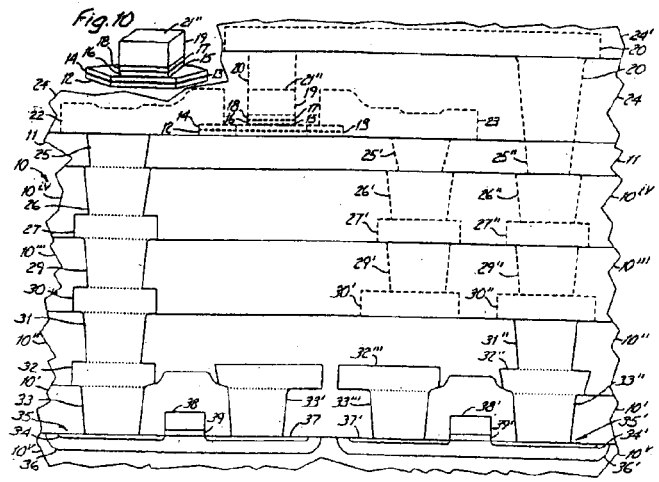

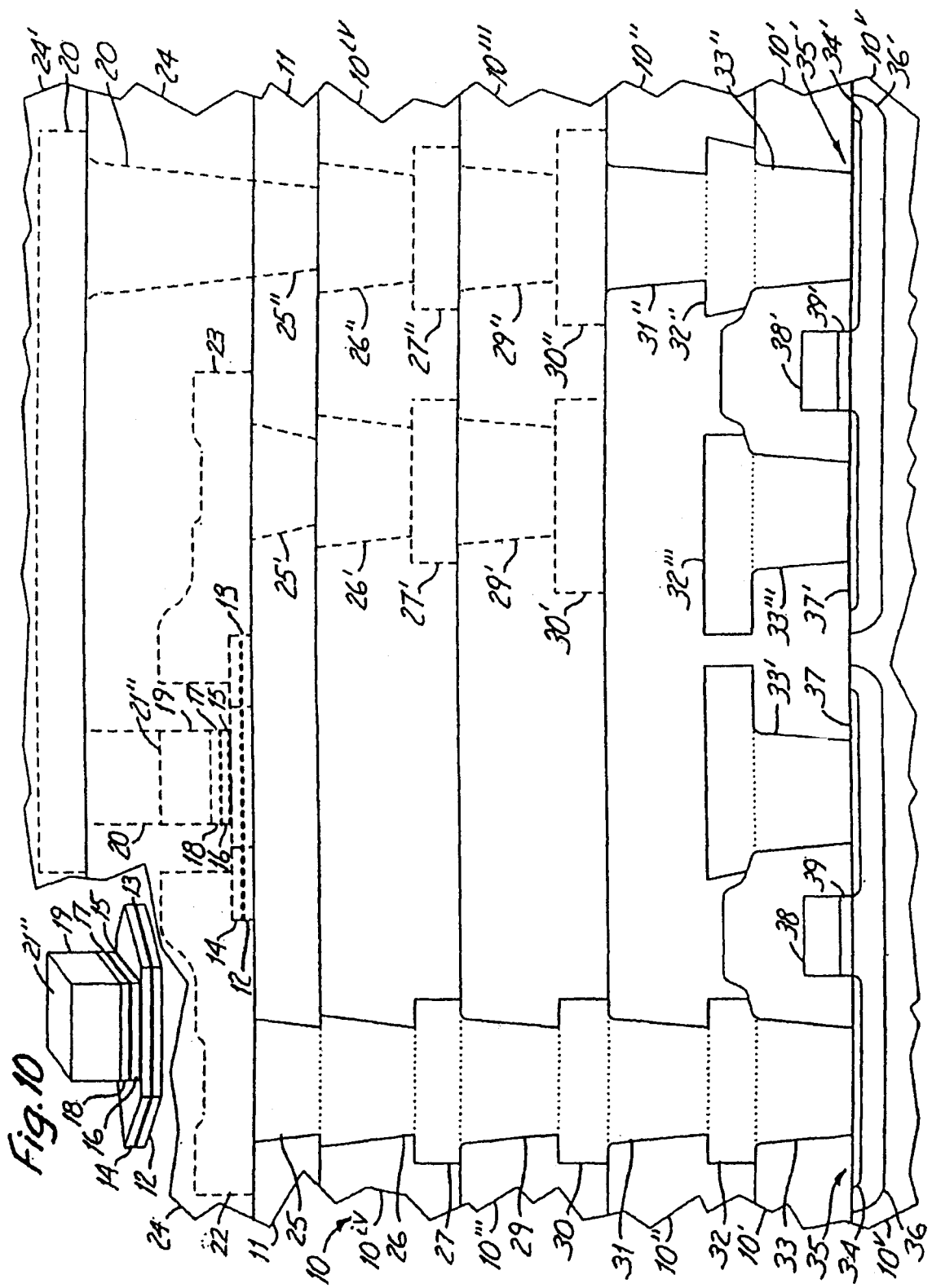

What is claimed is:

1. A ferromagnetic thin-film based digital memory, said memory comprising:
    a plurality of bit structures electrically interconnected with information storage and retrieval circuitry, said bit structures comprising:
        a relative orientation maintenance intermediate layer having two major surfaces on opposite sides thereof; and
        a pair of memory films of an anisotropic ferromagnetic material each on a corresponding one of said relative orientation maintenance intermediate layer major surfaces, said relative orientation maintenance intermediate layer being of a material and a selected thickness so as to maintain magnetizations of said memory films oriented in substantially opposite directions, said pair of memory films having sufficiently similar magnetic moments so as to substantially maintain magnetization orientations thereof despite magnetic fields occurring thereabout due to changes of magnetizations orientations of those said pairs of memory films in other said bit structures in said plurality thereof under direction of said information storage and retrieval circuitry; and
    interconnection electrodes having pairs thereof each in electrically conductive contact with a corresponding one of said bit structures with members in a said interconnection electrode pair contacting a corresponding bit structure being spaced apart from one another and each near or at edges of a said relative orientation maintenance intermediate layer major surface with at least one member of a said interconnection electrode pair being electrically coupled to said information storage and retrieval circuitry.

2. The apparatus of claim 1 further comprising in a said bit structure a nonmagnetic intermediate layer on one of said pair of memory films and across that said memory film from one of said relative orientation maintenance intermediate layer major surfaces, said nonmagnetic intermediate layer having a major surface on a side thereof opposite said pair of memory films, and a magnetization reference layer on said major surface of said nonmagnetic intermediate layer having a substantially fixed magnetization direction.

3. The apparatus of claim 1 further comprising a plurality of transistors electrically interconnected in said information storage and retrieval circuitry so that a said bit structure has a transistor in said plurality of transistors electrically coupled thereto that selectively substantially prevents current in at least one direction along a current path through that said bit structure.

4. The apparatus of claim 1 wherein said bit structures are provided on a substrate and said substrate further comprises a monolithic integrated circuit structure containing electronic circuit components of which at least one is electrically connected to a said bit structure.

5. The apparatus of claim 1 wherein a said bit structure has a length extending between a said pair of interconnection electrodes and a width substantially perpendicular thereto that is smaller in extent than said length, said width being less than about two curling lengths of said separate films from edges thereof substantially perpendicular to said width.

6. The apparatus of claim 2 wherein said nonmagnetic intermediate layer in said bit structure is an electrical conductor.

7. The apparatus of claim 2 wherein said nonmagnetic intermediate layer in said bit structure is an electrical insulator.

8. The apparatus of claim 2 wherein said magnetization reference layer in said bit structure comprises an antiferromagnetic layer positioned at a major surface of a first reference ferromagnetic thin-film layer.

9. The apparatus of claim 8 further comprising a plurality of electrical current conductors each positioned across an insulating layer from a corresponding said bit structure.

10. The apparatus of claim 8 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

11. The apparatus of claim 9 wherein said plurality of bit structures are each supported on a substrate and separated from one another by spacer material therebetween, and wherein a magnetic material layer in said magnetization reference layer has a characteristic magnetic property that is maintained below a critical temperature above which such magnetic property is not maintained, said bit structures each having a first interconnection structure providing electrical contact thereto positioned against at least one side thereof, and said plurality of electrical conductors each exhibits sufficient electrical resistance where across from a selected said corresponding bit structure for a sufficient electrical current therethrough to cause substantial heating of said selected corresponding bit structure to raise temperatures thereof to have said magnetic material layer therein approach said critical temperature thereof while being substantially above temperatures of at least an adjacent said bit structure because of sufficient extents of, and smallness of thermal conductivities of, said first interconnection structure positioned against said selected corresponding bit structure and of those portions of said substrate and said spacer material positioned thereabout.

12. The apparatus of claim 1 wherein said pairs of said interconnection electrodes in electrically conductive contact with a corresponding one of said bit structures are on substantially opposite sides thereof near or at substantially opposite edges of a said relative orientation maintenance intermediate layer major surface.

13. The apparatus of claim 1 further comprising a plurality of electrical current conductors each positioned across an insulating layer from a corresponding said bit structure.

14. The apparatus of claim 3 wherein said bit structure having a said transistor in said plurality of transistors electrically coupled thereto has said coupling provided at least in part by one of said pair of said interconnection electrodes in electrically conductive contact therewith.

15. The apparatus of claim 4 wherein said bit structure having a said electronic circuit component electrically coupled thereto has said coupling provided at least in part by one of said pair of said interconnection electrodes in electrically conductive contact therewith.

16. The apparatus of claim 13 wherein said plurality of bit structures are each supported on a substrate and separated from one another by spacer material therebetween, and wherein a magnetic material layer in said magnetization reference layer has a characteristic magnetic property that is maintained below a critical temperature above which such magnetic property is not maintained, said bit structures each having a first interconnection structure providing electrical contact thereto positioned against at least one side thereof, and said plurality of electrical conductors each exhibits sufficient electrical resistance where across from a selected said corresponding bit structure for a sufficient electrical current therethrough to cause substantial heating of said selected corresponding bit structure to raise temperatures thereof to have said magnetic material layer therein approach said critical temperature thereof while being substantially above temperatures of at least an adjacent said bit structure because of sufficient extents of, and smallness of thermal conductivities of, said first interconnection structure positioned against said selected corresponding bit structure and of those portions of said substrate and said spacer material positioned thereabout.

17. A ferromagnetic thin-film based digital memory, said memory comprising:
a plurality of bit structures electrically interconnected with information storage and retrieval circuitry, said bit structures comprising:
a relative orientation maintenance intermediate layer having two major surfaces on opposite sides thereof,
a pair of memory films of an anisotropic ferromagnetic material each on a corresponding one of said relative orientation maintenance intermediate layer major surfaces, said relative orientation maintenance intermediate layer being of a material and a selected thickness so as to maintain magnetizations of said memory films oriented in substantially opposite directions, said pair of memory films having sufficiently similar magnetic moments so as to substantially maintain magnetization orientations thereof despite magnetic fields occurring thereabout due to changes of magnetizations orientations of those said pairs of memory films in other said bit structures in said plurality thereof under direction of said information storage and retrieval circuitry;
a nonmagnetic intermediate layer of an electrically conductive material on one of said pair of memory films and across that said memory film from one of said relative orientation maintenance intermediate layer major surfaces with said nonmagnetic intermediate layer having a major surface on a side thereof opposite said pair of memory films; and
a magnetization reference layer on said major surface of said nonmagnetic intermediate layer having a substantially fixed magnetization direction; and
interconnection electrodes having pairs thereof each in electrically conductive contact with a corresponding one of said bit structures with members in a said interconnection electrode pair contacting a corresponding bit structure being spaced apart from one another and each near or at edges of a said relative orientation maintenance intermediate layer major surface with at least one member of a said interconnection electrode pair being electrically coupled to said information storage and retrieval circuitry.

18. The apparatus of claim 17 further comprising a plurality of transistors electrically interconnected in said information storage and retrieval circuitry so that a said bit structure has a transistor in said plurality of transistors electrically coupled thereto that selectively substantially prevents current in at least one direction along a current path through that said bit structure.

19. The apparatus of claim 17 wherein said bit structures are provided on a substrate and said substrate further comprises a monolithic integrated circuit structure containing electronic circuit components of which at least one is electrically connected to a said bit structure.

20. The apparatus of claim 17 wherein a said bit structure has a length extending between a said pair of interconnection electrodes and a width substantially perpendicular thereto that is smaller in extent than said length, said width being less than about two curling lengths of said separate films from edges thereof substantially perpendicular to said width.

21. The apparatus of claim 17 wherein said magnetization reference layer in a said bit structure comprises an antiferromagnetic layer positioned at a major surface of a first reference ferromagnetic thin-film layer.

22. The apparatus of claim 21 further comprising a plurality of electrical current conductors each positioned across an insulating layer from a corresponding said bit structure.

23. The apparatus of claim 21 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

24. The apparatus of claim 22 wherein said plurality of bit structures are each supported on a substrate and separated from one another by spacer material therebetween, and wherein a magnetic material layer in said magnetization reference layer has a characteristic magnetic property that is maintained below a critical temperature above which such magnetic property is not maintained, said bit structures each having a first interconnection structure providing electrical contact thereto positioned against at least one side thereof, and said plurality of electrical conductors each exhibits sufficient electrical resistance where across from a selected said corresponding bit structure for a sufficient electrical current therethrough to cause substantial heating of said selected corresponding bit structure to raise temperatures thereof to have said magnetic material layer therein approach said critical temperature thereof while being substantially above temperatures of at least an adjacent said bit structure because of sufficient extents of, and smallness of thermal conductivities of, said first interconnection structure positioned against said selected corresponding bit structure and of those portions of said substrate and said spacer material positioned thereabout.

25. The apparatus of claim 17 wherein said pairs of said interconnection electrodes in electrically conductive contact with a corresponding one of said bit structures are on substantially opposite sides thereof near or at substantially opposite edges of a said relative orientation maintenance intermediate layer major surface.

26. The apparatus of claim 18 wherein said bit structure having a said transistor in said plurality of transistors electrically coupled thereto has said coupling provided at least in part by one of said pair of said interconnection electrodes in electrically conductive contact therewith.

27. The apparatus of claim 19 wherein said bit structure having a said electronic circuit component electrically coupled thereto has said coupling provided at least in part by one of said pair of said interconnection electrodes in electrically conductive contact therewith.

28. A ferromagnetic thin-film based digital memory, said memory comprising:
a plurality of bit structures electrically interconnected with information storage and retrieval circuitry, said bit structures comprising:
a relative orientation maintenance intermediate layer having two major surfaces on opposite sides thereof; and
a memory film of an anisotropic ferromagnetic material on each of said relative orientation maintenance intermediate layer major surfaces, said relative orientation maintenance intermediate layer being of a material and a selected thickness so as to maintain magnetizations of said memory film, adjacent each of said intermediate layer major surfaces, oriented in substantially opposite directions;
a nonmagnetic intermediate layer of an electrically insulative material on said memory film across from one of said relative orientation maintenance intermediate layer major surfaces with said nonmagnetic intermediate layer having a major surface on a side thereof opposite said memory film; and
a magnetization reference layer on said major surface of said nonmagnetic intermediate layer having a substantially fixed magnetization direction; and
interconnection electrodes having pairs thereof each in electrically conductive contact with a corresponding one of said bit structures with members in a said interconnection electrode pair contacting a corresponding bit structure being spaced apart from one another and each near or at edges of a said relative orientation maintenance intermediate layer major surface with at least one member of a said interconnection electrode pair being electrically coupled to said information storage and retrieval circuitry.

29. The apparatus of claim 28 wherein said memory film at each of said major surfaces of said relative orientation maintenance intermediate layer of at least one of said bit structures is arranged such that there are two separate films with one of said separate films on each of said major surfaces.

30. The apparatus of claim 28 further comprising a plurality of transistors electrically interconnected in said information storage and retrieval circuitry so that a said bit structure has a transistor in said plurality of transistors electrically coupled thereto that selectively substantially prevents current in at least one direction along a current path through that said bit structure.

31. The apparatus of claim 28 wherein said bit structures are provided on a substrate and said substrate further comprises a monolithic integrated circuit structure containing electronic circuit components of which at least one is electrically connected to a said bit structure.

32. The apparatus of claim 29 wherein a said bit structure has a length extending between a said pair of interconnection electrodes and a width substantially perpendicular thereto that is smaller in extent than said length, said width being less than about two curling lengths of said separate films from edges thereof substantially perpendicular to said width.

33. The apparatus of claim 29 wherein said magnetization reference layer in a said bit structure comprises an antiferromagnetic layer positioned at a major surface of a first reference ferromagnetic thin-film layer.

34. The apparatus of claim 33 further comprising a plurality of electrical current conductors each positioned across an insulating layer from a corresponding said bit structure.

35. The apparatus of claim 33 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

36. The apparatus of claim 34 wherein said plurality of bit structures are each supported on a substrate and separated from one another by spacer material therebetween, and wherein a magnetic material layer in said magnetization reference layer has a characteristic magnetic property that is maintained below a critical temperature above which such magnetic property is not maintained, said bit structures each having a first interconnection structure providing electrical contact thereto positioned against at least one side thereof, and said plurality of electrical conductors each exhibits sufficient electrical resistance where across from a selected said corresponding bit structure for a sufficient electrical current therethrough to cause substantial heating of said selected corresponding bit structure to raise temperatures thereof to have said magnetic material layer therein approach said critical temperature thereof while being substantially above temperatures of at least an adjacent said bit structure because of sufficient extents of, and smallness of thermal conductivities of, said first interconnection structure positioned against said selected corresponding bit structure and of those portions of said substrate and said spacer material positioned thereabout.

37. The apparatus of claim 28 wherein said pairs of said interconnection electrodes in electrically conductive contact with a corresponding one of said bit structures are on substantially opposite sides thereof near or at substantially opposite edges of a said relative orientation maintenance intermediate layer major surface.

38. The apparatus of claim 30 wherein said bit structure having a said transistor in said plurality of transistors electrically coupled thereto has said coupling provided at least in part by one of said pair of said interconnection electrodes in electrically conductive contact therewith.

39. The apparatus of claim 31 wherein said bit structure having a said electronic circuit component electrically coupled thereto has said coupling provided at least in part by one of said pair of said interconnection electrodes in electrically conductive contact therewith.

40. A ferromagnetic thin-film based digital memory, said memory comprising:
a plurality of bit structures electrically interconnected with information storage and retrieval circuitry, said bit structures comprising:
a relative orientation maintenance intermediate layer having two major surfaces on opposite sides thereof;
a pair of memory films of an anisotropic ferromagnetic material each on a corresponding one of said relative orientation maintenance intermediate layer major surfaces, said relative orientation maintenance intermediate layer being of a material and a selected thickness so as to maintain magnetizations of said memory films oriented in substantially opposite directions, said pair of memory films having sufficiently similar magnetic moments so as to substantially maintain magnetization orientations thereof despite magnetic fields occurring thereabout due to changes of magnetizations orientations of those said pairs of memory films in other said bit structures in said plurality thereof under direction of said information storage and retrieval circuitry;

a nonmagnetic intermediate layer of a nonmagnetic material on one of said pair of memory films and across that said memory film from one of said relative orientation maintenance intermediate layer major surfaces with said nonmagnetic intermediate layer having a major surface on a side thereof opposite said pair of memory films; and a magnetization reference layer on said major surface of said nonmagnetic intermediate layer having a substantially fixed magnetization direction;

interconnection electrodes having at least pairs thereof each in electrically conductive contact with a corresponding one of said bit structures with members in a said interconnection electrode pair contacting a corresponding said bit structure being spaced apart from one another such that at least one said member of a said interconnection electrode pair is near or at an edge of a said relative orientation maintenance intermediate layer major surface; and a plurality of transistors electrically interconnected in said information storage and retrieval circuitry so that a said bit structure has a transistor in said plurality of transistors electrically coupled thereto at least in part by a member in that said interconnection electrode pair contacting that said bit structure so that said transistor selectively substantially prevents current in at least one direction through that said member and said bit structure.

41. The apparatus of claim 40 wherein said bit structures are provided on a substrate and said substrate further comprises a monolithic integrated circuit structure containing said plurality of transistors including said transistors electrically coupled to said bit structures.

42. The apparatus of claim 40 wherein said other member in that said electrode interconnection pair contacting a said bit structure is also near or at an edge of a said relative orientation maintenance intermediate layer major surface.

43. The apparatus of claim 42 wherein said other member in that said interconnection electrode pair contacting a said bit structure is electrically connected to another transistor in said plurality of transistors.

44. The apparatus of claim 40 wherein said other member in that said electrode interconnection pair contacting a said bit structure is at said magnetization reference layer.

45. The apparatus of claim 44 wherein said other member in that said interconnection electrode pair contacting a said bit structure is electrically connected to another transistor in said plurality of transistors.

46. The apparatus of claim 40 wherein said other member in that said interconnection electrode pair contacting a said bit structure is also near or at an edge of a said relative orientation maintenance intermediate layer major surface, and a further electrode is in electrical contact with that said bit structure at said magnetization reference layer.

47. The apparatus of claim 46 wherein at least one of said other member in that said interconnection electrode pair contacting a said bit structure and said further electrode is electrically connected to another transistor in said plurality of transistors.

48. The apparatus of claim 40 wherein at least said relative orientation maintenance intermediate layer and said pair of memory films of a said bit structure have a length extending from said member in that said electrode interconnection pair contacting a said bit structure near or at an edge of a said relative orientation maintenance intermediate layer major surface and a width substantially perpendicular thereto that is smaller in extent than said length, said width being less than about two curling lengths of said separate films from edges thereof substantially perpendicular to said width.

49. The apparatus of claim 40 wherein said nonmagnetic intermediate layer in a said bit structure is an electrical conductor.

50. The apparatus of claim 49 wherein said bit structures are provided on a substrate and said substrate further comprises a monolithic integrated circuit structure containing said plurality of transistors including said transistors electrically coupled to said bit structures.

51. The apparatus of claim 49 wherein said other member in that said electrode interconnection pair contacting a said bit structure is also near or at an edge of a said relative orientation maintenance intermediate layer major surface.

52. The apparatus of claim 51 wherein said other member in that said interconnection electrode pair contacting a said bit structure is electrically connected to another transistor in said plurality of transistors.

53. The apparatus of claim 49 wherein said other member in that said electrode interconnection pair contacting a said bit structure is at said magnetization reference layer.

54. The apparatus of claim 53 wherein said other member in that said interconnection electrode pair contacting a said bit structure is electrically connected to another transistor in said plurality of transistors.

55. The apparatus of claim 49 wherein said other member in that said interconnection electrode pair contacting a said bit structure is also near or at an edge of a said relative orientation maintenance intermediate layer major surface, and a further electrode is in electrical contact with that said bit structure at said magnetization reference layer.

56. The apparatus of claim 55 wherein at least one of said other member in that said interconnection electrode pair contacting a said bit structure and said further electrode is electrically connected to another transistor in said plurality of transistors.

57. The apparatus of claim 40 wherein said nonmagnetic intermediate layer in a said bit structure is an electrical insulator.

58. The apparatus of claim 57 wherein said bit structures are provided on a substrate and said substrate further comprises a monolithic integrated circuit structure containing said plurality of transistors including said transistors electrically coupled to said bit structures.

59. The apparatus of claim 57 wherein said other member in that said electrode interconnection pair contacting a said bit structure is also near or at an edge of a said relative orientation maintenance intermediate layer major surface.

60. The apparatus of claim 59 wherein said other member in that said interconnection electrode pair contacting a said bit structure is electrically connected to another transistor in said plurality of transistors.

61. The apparatus of claim 57 wherein said other member in that said electrode interconnection pair contacting a said bit structure is at said magnetization reference layer.

62. The apparatus of claim 61 wherein said other member in that said interconnection electrode pair contacting a said bit structure is electrically connected to another transistor in said plurality of transistors.

63. The apparatus of claim 57 wherein said other member in that said interconnection electrode pair contacting a said bit structure is also near or at an edge of a said relative orientation maintenance intermediate layer major surface, and a further electrode is in electrical contact with that said bit structure at said magnetization reference layer.

64. The apparatus of claim 63 wherein at least one of said other member in that said interconnection electrode pair contacting a said bit structure and said further electrode is electrically connected to another transistor in said plurality of transistors.

65. The apparatus of claim 40 wherein said magnetization reference layer in a said bit structure comprises an antiferromagnetic layer positioned at a major surface of a first reference ferromagnetic thin-film layer.

66. The apparatus of claim 65 wherein said magnetization reference layer further comprises a second reference ferromagnetic thin-film layer separated from said first reference ferromagnetic thin-film layer by an antiparallel magnetization directing layer forcing magnetizations of said first and second reference ferromagnetic thin-film layers to be oppositely directed.

67. The apparatus of claim 65 further comprising a plurality of electrical current conductors each positioned across an insulating layer from a corresponding said bit structure.

68. The apparatus of claim 67 wherein said plurality of bit structures are each supported on a substrate and separated from one another by spacer material therebetween, and wherein a magnetic material layer in said magnetization reference layer has a characteristic magnetic property that is maintained below a critical temperature above which such magnetic property is not maintained, said bit structures each having a first interconnection structure providing electrical contact thereto positioned against at least one side thereof, and said plurality of electrical conductors each exhibits sufficient electrical resistance where across from a selected said corresponding bit structure for a sufficient electrical current therethrough to cause substantial heating of said selected corresponding bit structure to raise temperatures thereof to have said magnetic material layer therein approach said critical temperature thereof while being substantially above temperatures of at least an adjacent said bit structure because of sufficient extents of, and smallness of thermal conductivities of, said first interconnection structure positioned against said selected corresponding bit structure and of those portions of said substrate and said spacer material positioned thereabout.

* * * * *

UNITED STATES PATENT AND TRADEMARK OFFICE
CERTIFICATE OF CORRECTION

PATENT NO. : 6,777,730 B2
DATED : August 17, 2004
INVENTOR(S) : James M. Daughton et al.

It is certified that error appears in the above-identified patent and that said Letters Patent is hereby corrected as shown below:

Column 31,
Line 22, delete "($\Omega$-$\mu$m$^2$)", insert -- ($\Omega$-$\mu$m$^2$) barrier --.
Line 23, delete "are", insert -- area --.

Signed and Sealed this

Twenty-ninth Day of November, 2005

JON W. DUDAS
*Director of the United States Patent and Trademark Office*

UNITED STATES PATENT AND TRADEMARK OFFICE
CERTIFICATE OF CORRECTION

PATENT NO. : 6,777,730 B2
APPLICATION NO. : 10/230474
DATED : August 17, 2004
INVENTOR(S) : James M. Daughton et al.

It is certified that error appears in the above-identified patent and that said Letters Patent is hereby corrected as shown below:

Title page, illustrative Fig. 10 should be deleted and substitute therefore the attached title page consisting of illustrative Fig. 10.

In the Drawings

The drawing sheets 1-7 and 13 consisting of Fig(s) 1-5 and 10 should be deleted and substitute therefore the attached drawing sheets 1-7 and 13 consisting of Fig(s) 1-5 and 10.

Signed and Sealed this

Twenty-ninth Day of June, 2010

David J. Kappos
*Director of the United States Patent and Trademark Office*

CERTIFICATE OF CORRECTION (continued)

(12) United States Patent
Daughton et al.

(10) Patent No.: US 6,777,730 B2
(45) Date of Patent: Aug. 17, 2004

(54) ANTIPARALLEL MAGNETORESISTIVE MEMORY CELLS

(75) Inventors: James M. Daughton, Eden Prairie, MN (US); Arthur V. Pohm, Ames, IA (US); Dexin Wang, Eden Prairie, MN (US)

(73) Assignee: NVE Corporation, Eden Prairie, MN (US)

( * ) Notice: Subject to any disclaimer, the term of this patent is extended or adjusted under 35 U.S.C. 154(b) by 0 days.

(21) Appl. No.: 10/230,474

(22) Filed: Aug. 29, 2002

(65) Prior Publication Data

US 2003/0048676 A1 Mar. 13, 2003

Related U.S. Application Data

(60) Provisional application No. 60/316,640, filed on Aug. 31, 2001.

(51) Int. Cl.$^7$ .................. H01L 31/119; H01L 21/00; G11C 11/00
(52) U.S. Cl. .................. 257/295; 257/311; 438/3; 438/257; 365/158; 365/145
(58) Field of Search .................. 257/295, 310, 257/311; 438/3, 257; 365/158, 145, 154, 157, 185.07

(56) References Cited

U.S. PATENT DOCUMENTS

| | | | |
|---|---|---|---|
| 4,945,397 A | * 7/1990 | Schuetz | 257/421 |
| 5,251,170 A | * 10/1993 | Daughton et al. | 365/158 |
| 5,343,422 A | 8/1994 | Kung et al. | 365/173 |
| 5,347,485 A | 9/1994 | Taguchi et al. | 365/171 |
| 5,477,482 A | 12/1995 | Prinz | 365/129 |
| 5,541,868 A | 7/1996 | Prinz | 365/98 |
| 5,640,343 A | 6/1997 | Gallagher et al. | 365/171 |
| 5,650,958 A | 7/1997 | Gallagher et al. | 365/173 |
| 5,734,605 A | 3/1998 | Zhu et al. | 365/173 |
| 5,936,293 A | * 8/1999 | Parkin | 257/422 |
| 5,949,707 A | 9/1999 | Pohm et al. | 365/158 |
| 5,966,012 A | 10/1999 | Parkin | |
| 5,966,322 A | * 10/1999 | Pohm et al. | 365/158 |

(List continued on next page.)

OTHER PUBLICATIONS

J.-E. Wegrowe, D. Kelly, X. Hoffer, Ph. Guittienne, J.-Ph. Ansermet. Tailoring AMR and GMR Hysteresis Loops with Spin–Polarized Current Injection. *Institut de Physique Expérimentale, Ecole Polytechnique Fédéale de Lausanne*, CH– 1015 Lausanne, Switzerland. Dec. 4, 2000.

(List continued on next page.)

*Primary Examiner*—David Nelms
*Assistant Examiner*—Long Tran
(74) *Attorney, Agent, or Firm*—Kinney & Lange, P.A.

(57) ABSTRACT

A ferromagnetic thin-film based digital memory having a plurality of bit structures electrically interconnected with information storage and retrieval circuitry that avoids information loss in one bit structure because of operating the others through this circuitry. Each of these bit structures formed of a relative orientation maintenance intermediate layer having two major surfaces on opposite sides thereof with a pair of memory films of an anisotropic ferromagnetic material each on a corresponding one of said relative orientation maintenance intermediate layer major surfaces. The relative orientation maintenance intermediate layer is of a material and a selected thickness so as to maintain magnetizations of said memory films oriented in substantially opposite directions. Interconnection electrodes pairs are each in electrically conductive contact with a corresponding one of the bit structures on substantially opposite sides thereof near or at substantially opposite edges of the relative orientation maintenance intermediate layer major surface. A magnetization reference direction layer able to maintain relatively well its magnetization orientation can be provided across a nonmagnetic layer from one of the pair of memory films with the nonmagnetic layer being either electrically conductive or insulative.

68 Claims, 16 Drawing Sheets